(12) United States Patent  
Griffin

(10) Patent No.: US 10,459,495 B2  
(45) Date of Patent: Oct. 29, 2019

(54) WEARABLE ELECTRONIC DEVICES HAVING AN INWARD FACING INPUT DEVICE AND METHODS OF USE THEREOF

(71) Applicant: NORTH INC., Kitchener (CA)

(72) Inventor: Jason T. Griffin, Kitchener (CA)

(73) Assignee: North Inc., Kitchener, ON (CA)

( * ) Notice: Subject to any disclaimer, the term of this patent is extended or adjusted under 35 U.S.C. 154(b) by 0 days.

(21) Appl. No.: 16/226,422

(22) Filed: Dec. 19, 2018

(65) Prior Publication Data

US 2019/0187751 A1    Jun. 20, 2019

Related U.S. Application Data

(60) Provisional application No. 62/607,819, filed on Dec. 19, 2017.

(51) Int. Cl.
| | |
|---|---|
| *G06F 1/16* | (2006.01) |
| *G06F 3/044* | (2006.01) |
| *G06F 3/041* | (2006.01) |
| *H04W 4/20* | (2018.01) |
| *H05K 5/00* | (2006.01) |
| *H05K 7/14* | (2006.01) |
| *G06F 3/0354* | (2013.01) |

(52) U.S. Cl.
CPC .............. *G06F 1/169* (2013.01); *G06F 1/163* (2013.01); *G06F 3/03547* (2013.01); *G06F 3/044* (2013.01); *G06F 3/0414* (2013.01); *H04W 4/20* (2013.01); *H05K 5/0086* (2013.01); *H05K 7/1401* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,514,861 A | * | 5/1996 | Swartz | G06F 1/163 235/462.44 |
| 5,587,577 A | * | 12/1996 | Schultz | B60R 11/02 235/462.44 |
| 5,610,387 A | * | 3/1997 | Bard | G04B 47/00 235/462.44 |
| 5,793,032 A | * | 8/1998 | Bard | G04B 37/0016 235/462.15 |
| 5,898,161 A | * | 4/1999 | DeVita | G04B 37/0016 235/462.44 |

(Continued)

*Primary Examiner* — Lisa Lea-Edmonds  
(74) *Attorney, Agent, or Firm* — Thomas Mahon

(57) ABSTRACT

A wearable electronic device is provided herein. The wearable electronic device includes a body defining an aperture therethrough. The aperture is sized and shaped to receive a finger of a user. The wearable electronic device further includes a computer processor and an input device at least partially extending from an inner surface of the body. The input device is movable between a first position and a second position. Movement of the input device between the first position and second position provides an input to the processor. The electronic wearable device also includes a transmitter coupled to the computer processor and configured to send electronic transmissions to an external electronic device. The electronic transmissions correspond to the input. The electronic wearable device also includes a power source for providing power to the computer processor, the input device and the transmitter.

13 Claims, 22 Drawing Sheets

(56) References Cited

U.S. PATENT DOCUMENTS

| | | | | |
|---|---|---|---|---|
| 6,036,093 | A * | 3/2000 | Schultz | G06F 1/163 235/462.43 |
| 6,145,746 | A * | 11/2000 | Bard | G04B 37/0016 235/462.45 |
| 6,380,923 | B1 * | 4/2002 | Fukumoto | G06F 1/163 341/22 |
| 6,607,134 | B1 * | 8/2003 | Bard | G04B 47/00 235/462.44 |
| 6,778,380 | B2 * | 8/2004 | Murray, Jr. | H01H 9/0235 340/12.55 |
| 6,912,287 | B1 * | 6/2005 | Fukumoto | G06F 1/163 379/430 |
| RE40,956 | E * | 11/2009 | Murray, Jr. | H01H 9/0235 340/4.37 |
| 8,260,384 | B2 * | 9/2012 | Wulff | A45F 5/00 224/267 |
| 8,514,173 | B2 * | 8/2013 | Urbach, III | G06F 3/0338 345/156 |
| 8,570,273 | B1 * | 10/2013 | Smith | G06F 3/0338 345/156 |
| 8,605,036 | B1 * | 12/2013 | Kelly | G06F 3/014 345/156 |
| 8,872,729 | B2 * | 10/2014 | Lyons | G04G 17/083 345/1.1 |
| 9,329,716 | B2 * | 5/2016 | Parham | G06F 3/0304 |
| 9,335,790 | B1 * | 5/2016 | Stotler | G06F 1/163 |
| 9,495,575 | B2 * | 11/2016 | Kim | H04B 1/385 |
| 9,524,137 | B2 * | 12/2016 | Wan | G06F 1/163 |
| 9,535,516 | B2 * | 1/2017 | Parham | G06F 3/0304 |
| 9,582,034 | B2 * | 2/2017 | von Badinski | G01P 15/00 |
| 9,594,427 | B2 * | 3/2017 | Priyantha | G06F 3/017 |
| 9,600,030 | B2 * | 3/2017 | Bailey | G06F 1/163 |
| 9,645,610 | B1 * | 5/2017 | Chang | G06F 1/163 |
| 9,651,992 | B2 * | 5/2017 | Stotler | G06F 1/163 |
| 9,690,387 | B2 * | 6/2017 | Hatton | G06F 3/017 |
| 9,696,802 | B2 * | 7/2017 | Priyantha | H04B 5/0037 |
| 9,860,622 | B2 * | 1/2018 | Wong | H04R 1/028 |
| 9,861,314 | B2 * | 1/2018 | Haverinen | A61B 5/6801 |
| 9,880,619 | B2 * | 1/2018 | Parham | G06F 3/014 |
| 9,880,632 | B2 * | 1/2018 | Ataee | G06F 3/017 |
| 9,891,665 | B2 * | 2/2018 | Han | G06F 1/163 |
| 9,946,457 | B2 * | 4/2018 | Warren | G06F 3/04883 |
| 9,958,904 | B2 * | 5/2018 | von Badinski | G01P 15/00 |
| 10,043,125 | B2 * | 8/2018 | Park | G06K 19/07762 |
| 10,055,064 | B2 * | 8/2018 | Tokutake | G06F 3/0481 |
| 10,082,829 | B2 * | 9/2018 | Kuwabara | G06F 1/163 |
| 10,126,779 | B2 * | 11/2018 | von Badinski | G01P 15/00 |
| 10,139,859 | B2 * | 11/2018 | von Badinski | G01P 15/00 |
| 10,139,906 | B1 * | 11/2018 | Bai | G06F 3/014 |
| 10,152,082 | B2 * | 12/2018 | Bailey | G06F 1/163 |
| 10,156,867 | B2 * | 12/2018 | von Badinski | G01P 15/00 |
| 10,199,008 | B2 * | 2/2019 | Aleem | G06F 3/015 |
| 10,281,953 | B2 * | 5/2019 | von Badinski | G06F 3/1423 |
| 10,289,159 | B2 * | 5/2019 | Lee | G06F 1/163 |
| 10,317,940 | B2 * | 6/2019 | Eim | G06F 1/163 |
| 2007/0063992 | A1 * | 3/2007 | Lundquist | G06F 1/163 345/174 |
| 2011/0007035 | A1 * | 1/2011 | Shai | G06F 3/014 345/179 |
| 2011/0187637 | A1 * | 8/2011 | Nichols | G06F 3/044 345/156 |
| 2015/0241985 | A1 * | 8/2015 | Elangovan | G06F 3/017 345/174 |
| 2015/0277559 | A1 * | 10/2015 | Vescovi | G06F 3/014 345/173 |
| 2015/0309535 | A1 * | 10/2015 | Connor | G06F 1/163 361/679.03 |
| 2016/0098086 | A1 * | 4/2016 | Li | G01P 13/045 345/173 |
| 2016/0209920 | A1 * | 7/2016 | Mastandrea | G06F 3/014 |
| 2016/0261834 | A1 * | 9/2016 | Li | G06F 3/03545 |
| 2016/0317060 | A1 * | 11/2016 | Connor | G01J 3/0294 |
| 2017/0024007 | A1 * | 1/2017 | Pelis | G06F 3/014 |
| 2017/0045948 | A1 * | 2/2017 | Nattukallingal | G06F 3/04883 |
| 2017/0147033 | A1 * | 5/2017 | Pastorino | G06F 3/0362 |
| 2017/0330471 | A1 * | 11/2017 | Subiakto | G09B 5/065 |
| 2018/0103902 | A1 * | 4/2018 | Haverinen | A61B 5/6801 |
| 2018/0167549 | A1 * | 6/2018 | Lim | H04N 5/2252 |
| 2018/0225039 | A1 * | 8/2018 | Warren | G06F 3/04883 |
| 2018/0239429 | A1 * | 8/2018 | Gupta | G06F 3/014 |
| 2018/0307268 | A1 * | 10/2018 | Stotler | G06F 1/163 |
| 2018/0317770 | A1 * | 11/2018 | Ortega | A61B 5/6824 |
| 2019/0067968 | A1 * | 2/2019 | Guo | H02J 7/0045 |

* cited by examiner

WEARABLE ELECTRONIC DEVICES HAVING AN INWARD FACING INPUT DEVICE AND METHODS OF USE THEREOF

TECHNICAL FIELD

The present systems, devices, and methods generally relate to wearable electronic devices and particularly relate to wearable electronic devices having inward facing input devices.

BACKGROUND

Description of the Related Art

Wearable Electronic Devices

Electronic devices are commonplace throughout most of the world today. Advancements in integrated circuit technology have enabled the development of electronic devices that are sufficiently small and lightweight to be carried by the user. Such "portable" electronic devices may include on-board power supplies (such as batteries or other power storage systems) and may be "wireless" (i.e., designed to operate without any wire-connections to other, non-portable electronic systems); however, a small and lightweight electronic device may still be considered portable even if it includes a wire-connection to a non-portable electronic system. For example, a microphone may be considered a portable electronic device whether it is operated wirelessly or through a wire-connection.

The convenience afforded by the portability of electronic devices has fostered a huge industry. Smartphones, audio players, laptop computers, tablet computers, and ebook readers are all examples of portable electronic devices. However, the convenience of being able to carry a portable electronic device has also introduced the inconvenience of having one's hand(s) encumbered by the device itself. This problem is addressed by making an electronic device not only portable, but wearable.

A wearable electronic device is any portable electronic device that a user can carry without physically grasping, clutching, or otherwise holding onto the device with their hands. For example, a wearable electronic device may be attached or coupled to the user by a strap or straps, a band or bands, a clip or clips, an adhesive, a pin and clasp, an article of clothing, tension or elastic support, an interference fit, an ergonomic form, etc. Examples of wearable electronic devices include digital wristwatches, electronic armbands, electronic rings, electronic ankle-bracelets or "anklets," head-mounted electronic display units, hearing aids, and so on.

Because they are worn on the body of the user, visible to others, and generally present for long periods of time, form factor (i.e., size, geometry, and appearance) is a major design consideration in wearable electronic devices.

BRIEF SUMMARY

According to a broad aspect, a wearable electronic device is provided herein: The wearable electronic device includes a body having an inner surface defining an aperture there through. The aperture is sized and shaped to receive a finger of a user. The wearable electronic device further includes a computer processor and at least one input device positioned proximate the inner surface of the body. The input device is movable between a first position and a second position to provide an input to the processor. The electronic wearable device also includes a transmitter coupled to the computer processor to send electronic transmissions. The electronic transmissions correspond to the input.

According to other aspects, the computer processor, the at least one input device, and the transmitter can be housed in a removable housing coupled to the body.

According to other aspects, the removable housing can be coupled to the body by a clip surrounding a portion of the body.

According to other aspects, the at least one input device can protrude from an inner portion of the housing towards the aperture of the body.

According to other aspects, the wearable electronic device can further include a touch pad.

According to other aspects, the touch pad can protrude from an outside surface of the body.

According to other aspects, the touch pad can be a capacitive touch screen.

According to other aspects, the wearable electronic device can include three input devices.

According to other aspects, one input device can be positioned on a protrusion of the body.

According to other aspects, the body has an annular shape.

According to other aspects, the wearable electronic device can include a power source for providing power to the computer processor, the input device, and the transmitter. The power source can be a rechargeable charging member.

According to a broad aspect, a method of controlling an external electronic device with a wearable electronic device is provided herein. The method includes receiving via a first input device positioned on an inner surface of a body of the wearable electronic device a first input. The first input device is coupled to a processor of the wearable electronic device. The first input corresponds to a movement of the first input device between a first position and a second position. The method also includes transmitting by a transmitter of the wearable electronic device a first signal based on the first input to the external electronic device. The first signal corresponds to a first command to be executed by the external electronic device.

According to other aspects, the first input can be associated to the first command by the processor of the wearable electronic device and the first command is transmitted as the first signal to the external electronic device.

According to other aspects, the first input can be associated to the first command by a processor of the external electronic device.

According to other aspects, the method can further include receiving via a second input device positioned on the inner surface of the body of the wearable electronic device a second input, the second input device coupled to the processor of the wearable electronic device, the second input corresponding to a movement of the second input device between a first position and a second position; and transmitting by the transmitter of the wearable electronic device a second signal based on the second input to the external electronic device, the second signal corresponding to a second command to be executed by the external electronic device.

According to other aspects, the method can further include: receiving via a third input device positioned on the inner surface of the body of the wearable electronic device a third input, the third input device coupled to the processor of the wearable electronic device, the third input corresponding to a movement of the third input device between a first position and a second position; and transmitting by the transmitter of the wearable electronic device a third signal based on the third input to the external electronic device, the third signal corresponding to a third command to be executed by the external electronic device.

According to other aspects, receiving via a first input device positioned on an inner surface of a body of the wearable electronic device a first input can include receiving via the first input device a sequence of movements of the first input device between the first position and the second position.

According to other aspects, the method can further include receiving via a second input device positioned on the inner surface of the body of the wearable electronic device a second input, the second input device coupled to the processor of the wearable electronic device, the second input corresponding to a movement of the second input device between a first position and a second position, wherein: transmitting by a transmitter of the wearable electronic device a first signal based on the first input to the external electronic device comprises transmitting by the transmitter of the wearable electronic device the first signal based on the first input and the second input to the external electronic device.

According to other aspects, the acts of: receiving via a first input device positioned on an inner surface of a body of the wearable electronic device a first input, and receiving via a second input device positioned on the inner surface of the body of the wearable electronic device a second input, can be performed simultaneously.

According to other aspects, the acts of: receiving via a first input device positioned on an inner surface of a body of the wearable electronic device a first input, and receiving via a second input device positioned on the inner surface of the body of the wearable electronic device a second input, are performed sequentially.

According to a broad aspect, a system is provided herein. The system includes a wearable electronic device including a body having an inner surface defining an aperture there through. The aperture is sized and shaped to receive a finger of a user. The wearable electronic device further includes a computer processor and at least one input device positioned proximate the inner surface of the body and exposed to the aperture. The input device is movable between a first position and a second position to provide an input to the processor. The electronic wearable device also includes a transmitter coupled to the computer processor to send electronic transmissions. The electronic transmissions correspond to the input. The system also includes an external electronic device communicatively coupled to the wearable electronic device to receive the electronic transmissions corresponding to the input.

According to other aspects, the computer processor, the input device, and the transmitter can be housed in a removable housing coupled to the body of the wearable electronic device.

According to other aspects, the removable housing can be coupled to the body by a clip surrounding a portion of the body.

According to other aspects, the input device can protrude from an inner portion of the housing towards the aperture of the body.

According to other aspects, the system can further include a touch pad.

According to other aspects, the touch pad can protrude from an outside surface of the body.

According to other aspects, the touch pad can be a capacitive touch pad.

According to other aspects, the wearable electronic device can include three input devices.

According to other aspects, one input device can be positioned on a protrusion of the body.

According to other aspects, the body can have an annular shape.

According to other aspects, the wearable electronic device can further include a power source for providing power to the computer processor, the input device, and the transmitter. The power source can be a rechargeable charging member.

According to a broad aspect, a wearable electronic device is provided herein. The wearable electronic device includes a body having an aperture there through, the aperture sized and shaped to receive a finger of a user; an input area including: at least one pressure sensing pad to detect a first input from the user; and at least one capacitive pad to detect a second input from the user, the at least one capacitive pad at least partially overlapping the at least one pressure sensing pad; and a transmitter coupled to the at least one pressure sensing pad and the at least one capacitive area to send electronic transmissions, the electronic transmissions corresponding to the first input and the second input.

According to other aspects, the wearable electronic device can further include a processor coupled to the at least one pressure sensing pad, the at least one capacitive pad, and the transmitter.

According to other aspects, the processor, the at least one capacitive pad, the at least one pressure sensing pad, and the transmitter can be housed in a removable housing coupled to the body.

According to other aspects, the removable housing can be coupled to the body by a clip surrounding a portion of the body.

According to other aspects, the at least one capacitive pad can include a one-dimensional array of capacitive sensors.

According to other aspects, the at least one capacitive pad can include a two-dimensional array of capacitive sensors.

According to other aspects, the at least one capacitive pad can include an analog capacitive sensor.

According to other aspects, the at least one pressure sensing pad can include a single pressure sensing pad.

According to other aspects, the at least one pressure sensing pad can include a plurality of discrete pressure sensing pads.

According to other aspects, the at least one pressure sensing pad can include an analog pressure sensing pad.

According to other aspects, the body can have an annular shape.

According to other aspects, the wearable electronic device can further include a power source for providing power to the processor, the at least one capacitive pad, the at least one pressure sensing pad, and the transmitter. The power source can be a rechargeable charging member.

According to a broad aspect, a method of controlling an external electronic device with a wearable electronic device is described herein. The method can include: receiving via at least one pressure sensing pad of the wearable electronic device a first input corresponding to an application of pressure to the at least one pressure sensing pad by a user; receiving via at least one capacitive pad of the wearable electronic device a second input corresponding to a touch of the capacitive pad by the user; and transmitting by a transmitter of the wearable electronic device a first signal based on the first input and a second signal based on the second input to the external electronic device, the first signal corresponding to a first command to be executed by the external electronic device, the second signal corresponding to a second command to be executed by the external electronic device.

According to other aspects, the first input can be associated to the first command by a processor of the wearable electronic device and the first command is transmitted as the first signal to the external electronic device, and the second input can be associated to the second command by the processor of the wearable electronic device and the second command is transmitted as the second signal to the external electronic device.

According to other aspects, the first input can be associated to the first command by a processor of the external electronic device, and the second input can be associated to the second command by the processor of the external electronic device.

According to other aspects, receiving via at least one pressure sensing pad of the wearable electronic device a first input corresponding to an application of pressure to the at least one pressure sensing pad by a user can include receiving via a single pressure sensing pad among a plurality of pressure sensing pads of the wearable electronic device a first input corresponding to an application of pressure to the single pressure sensing pad by a user.

According to other aspects, receiving via at least one pressure sensing pad of the wearable electronic device a first input corresponding to an application of pressure to the at least one pressure sensing pad by a user can include receiving via a region of an analog pressure sensing pad of the wearable electronic device a first input corresponding to an application of pressure to the analog pressure sensing pad by a user.

According to other aspects, receiving via at least one capacitive pad of the wearable electronic device a second input corresponding to a touch of the capacitive pad by the user can include receiving via the at least one capacitive pad of the wearable electronic device the second input corresponding to a swipe along the capacitive pad by the user.

According to other aspects receiving via at least one capacitive pad of the wearable electronic device a second input corresponding to a touch of the capacitive pad by the user can include receiving via the at least one capacitive pad of the wearable electronic device the second input corresponding to a multi-directional gesture swipe along the capacitive pad by the user.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

Figure 1:
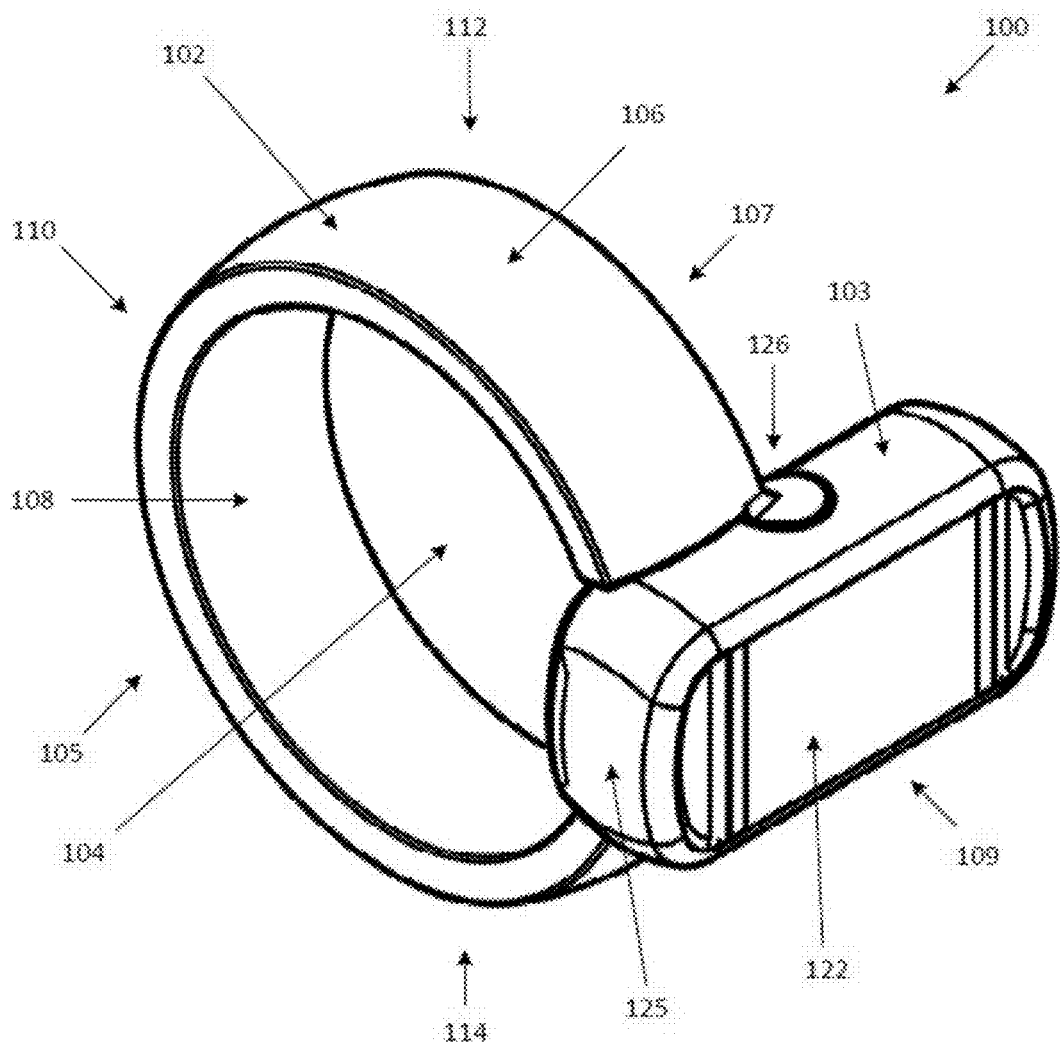
FIG. 1 is a front perspective view of a wearable electronic device having an inward facing input device, according to one implementation.
Figure 2:
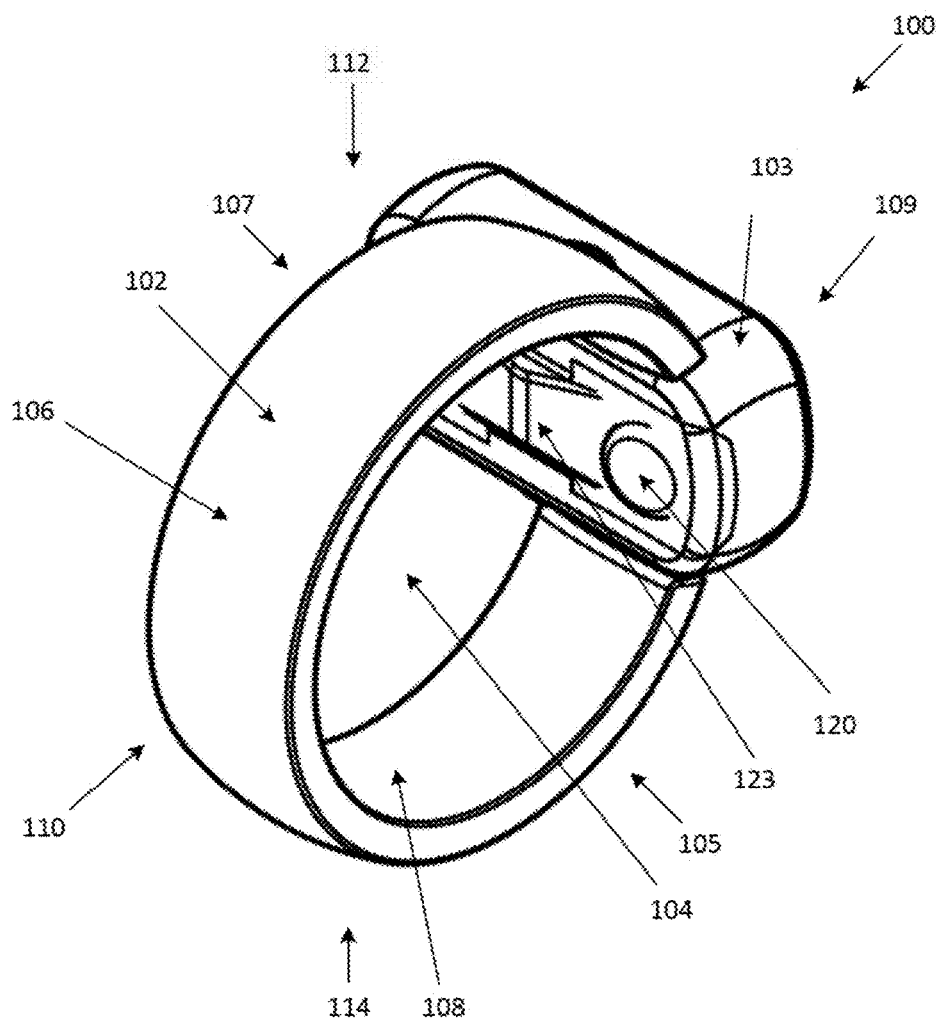
FIG. 2 is a rear perspective view of the wearable electronic device of FIG. 1.
Figure 3:
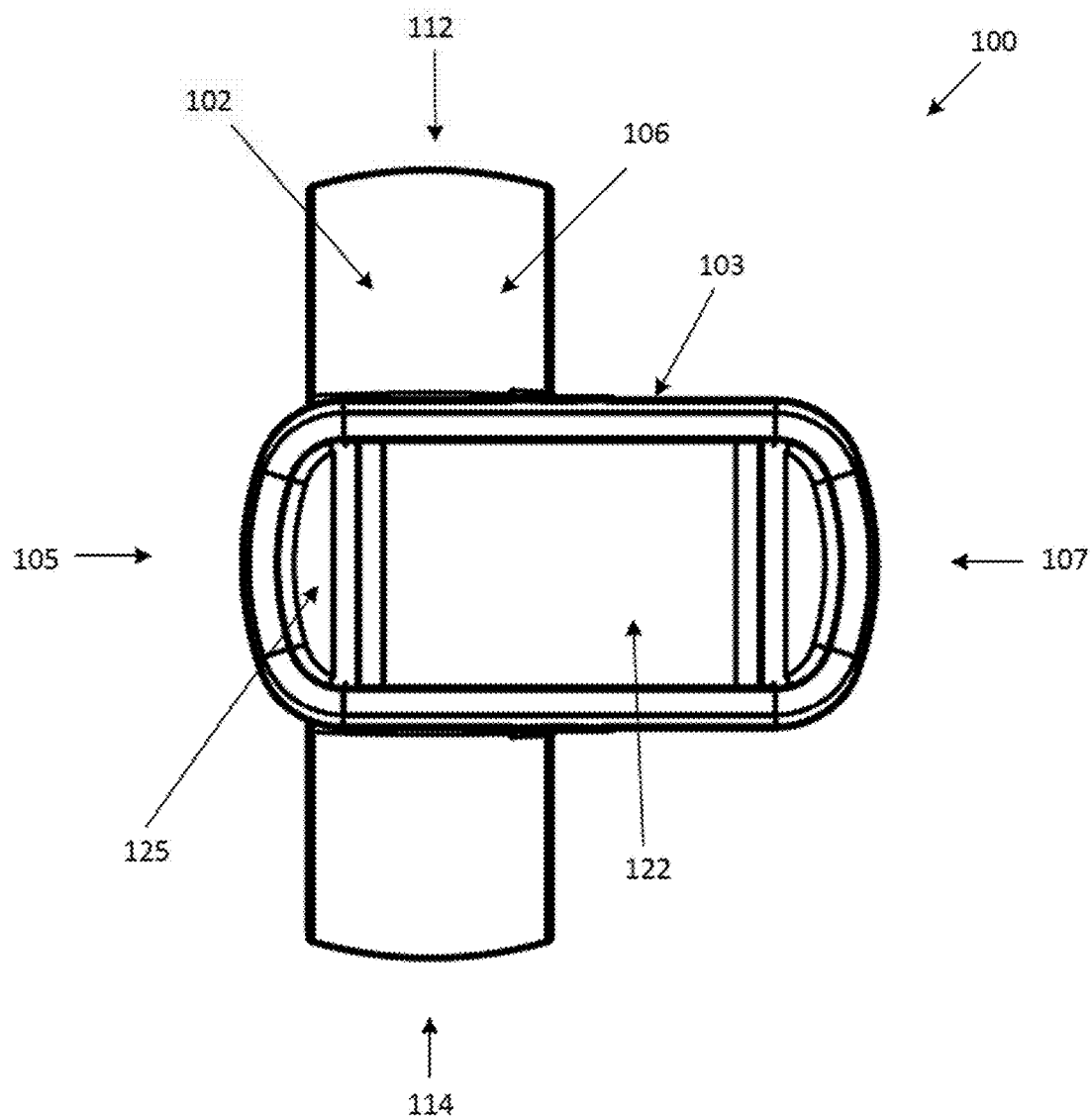
FIG. 3 is a front plan view of the wearable electronic device of FIG. 1.
Figure 4:
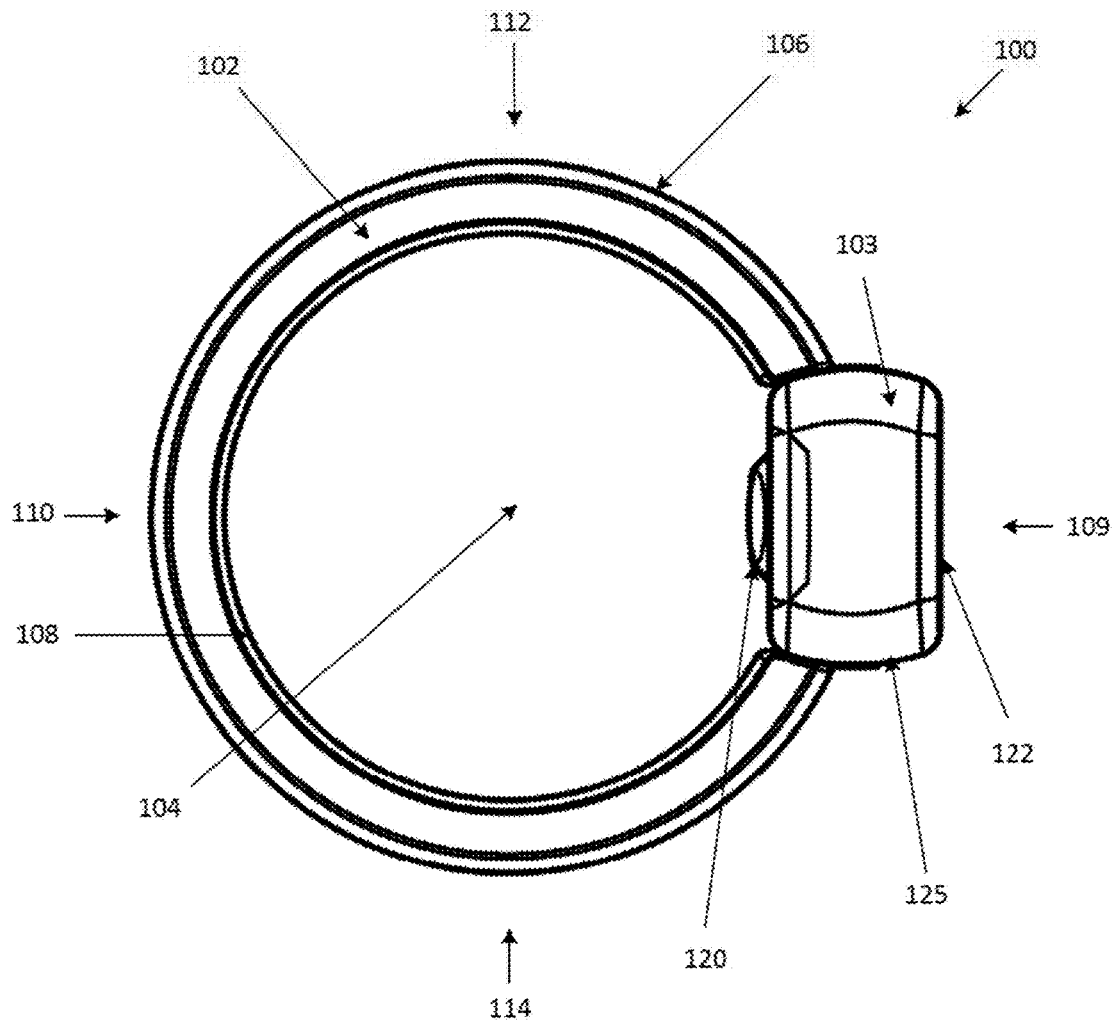
FIG. 4 is a side view of the wearable electronic device of FIG. 1.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with portable electronic devices and head-worn devices, have not been shown or described in detail to avoid unnecessarily obscuring descriptions of the implementations.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one implementation" or "an implementation" means that a particular feature, structures, or characteristics may be combined in any suitable manner in one or more implementations.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations.

Referring to FIGS. 1 to 4, illustrated therein is a wearable electronic device 100 having at least one multi-use single switch as an input device 120, according to one implementation. Wearable electronic device 100 has a body 102 and a removable housing 103 coupled thereto housing the input device 120 and one or more electronic components (such as but not limited to a processor, memory, sensors, a charging member, etc. as described below). Accordingly, housing 103 and input device 120 are separable from the body 102, thereby providing for a user to replace the body 102 with a replacement body 102 that may be of a different size, color, or material or allowing the user to place the input device 120 (and some or all of its associated electronics housed therein) in an external device or apparatus, such as an appliance, television, or automobile dashboard or any other appropriate external device.

Body 102 defines an aperture 104 capable of receiving a user's finger. Wearable electronic device 100 has a first side 105, a second side 107 opposed to the first side 105, a first end 109 and a second end 110 opposed to the first end 109, and a top portion 112 and a bottom portion 114 opposed to the top portion 112. Body 102 generally has an annular shape and includes an outer surface 106 and an inner surface 108. The inner surface 108 is sized and/or shaped to conform to the finger of the user. The inner surface 108 thereby rests against the user's finger when the device 100 is worn by the user. Wearable electronic device 100 may be available in a variety of sizes for accommodating various finger sizes and/or various types of fingers.

In some implementations, the body 102 is made from a rigid or semi-rigid material such as a metal or a plastic. For instance, the body 102 may be made of gold, silver, platinum, or any other appropriate metal.

As mentioned above, wearable electronic device 100 includes a removable housing 103 having one or more input devices 120 to receive inputs from a user. As shown on FIG. 2, housing 103 couples to body 102 such that at least a portion of housing 103 surrounds at least a portion of body 102. For instance, housing 103 may include an inner portion 123 and an outer portion 125. Inner portion 123 may have a clip 126. Inner portion 123 may extend through aperture 104 of body 102 such that clip 126 can couple to a portion of outer portion 125 extending laterally from body 102. In the implementation shown in FIGS. 1 to 4, clip 126 couples to outer portion 125 extending from body 102 in a direction towards second side 107. As shown, housing 103 surrounds at least a portion of body 102 when coupled thereto such that inner portion 123 rests against inner surface 108 of body 102 and outer portion 125 rests against outer surface 106 (e.g., housing 103 is held in place by friction). Removable housing 103 also at least partially protrudes from outer surface 106 to provide a surface 122 for actuating input device 120.

The input device 120 can be mechanical, electro-mechanical, and/or sensor (e.g., a membrane sensor)-based, and in more general terms provides a surface for receiving a user-applied actuation force or action. The input device 120 may be integrally formed with body 102, housing 103, mounted to body 102, mounted to housing 103 or otherwise extend from body 102 or housing 103 such that input device 120 faces, or is exposed or accessible at, the inner surface 108 of one of the body 102 or the housing 103. The input device 120 may also be optionally recessed relative to the inner surface 108 of the body 102 or the housing 103 to inhibit incidental contact and unintentional activation of the input device 120.

The input device 120 can assume a wide variety of forms appropriate for actuation against a user's finger (e.g., by indirect application of force against an outer surface 106 of the body 102 adjacent to input device 120 to direct input device 120 against the user's finger upon which the wearable electronic device is worn). In the implementation shown in FIGS. 1 to 4, input device 120 is a multi-use single switch. A user can actuate the input device 120 by engaging and/or applying a force to the outer surface 106 of the body 102 adjacent to input device 120 to direct input device 120 against the user's finger upon which the wearable electronic device is worn. In the implementation shown in FIGS. 1 to 4, the input device 120 extends from inner portion 123 of housing 103 such that a force actuated against surface 106 (e.g., pad 122) presses the input device 120 against the user's finger as the wearable electronic device 100 is worn by the user. Input device 120 may be configured to be positively actuated only upon the contact of a certain percentage of the outer surface 106 or certain minimum pressure on a pressure sensor-type switch to avoid unintended activation.

In some implementations, input device 120 may be a mechanical switch and include a depressible component that makes contact with a conductive element in response to a user applying a force to the depressible component. Upon release of the force applied by the user, the depressible component may thereafter return to a default position in response to an expansion of a spring or other biasing element. In some implementations, the input device 120 may be electrically operated by sensing touch or proximity (e.g., by measuring capacitance of a user's finger).

Referring to FIGS. 1 to 5, illustrated therein is an implementation of wearable electronic device 100 where multi-use single switch input device 120 is shown as a button that can be depressed upon applying a force against a capacitive pad 122, for example.

Capacitive pad 122 is a touch screen or touch pad for a user to provide inputs into housing 103. Capacitive pad 122 may be any shape or size such as but not limited to square, rectangular, circular, or oval shaped, In some implementations, the actuating surface 122 is a capacitive touch screen, a resistive touch screen, or any other type of touch screen or touch pad known in the art. The resolution of the touch screen or pad may be approximately equal to that of the touch screen of a tablet computer or wrist computer (i.e., smart watch) or that of a laptop touchpad; in other implementations, the resolution may be greater or smaller. Capacitive pad 122 is touch sensitive, allowing taps in different areas and scrolling along the housing 103.

An input can be provided to the wearable electronic device 100 by the user engaging input device 120 and/or capacitive pad 122. For instance, a user can engage the input device 120 when a finger of the user makes physical contact with outer surface 106 adjacent to input device 120 to depress the input device 120 against the user's finger inserted into aperture 104 when the wearable electronic device 100 is worn by the user. A user can also engage capacitive pad 122 and actuates the capacitive pad 122 using a finger other than the finger upon which the wearable electronic device 100 is worn. The physical actuation (e.g., manipulation) of the capacitive pad 122 and/or the depression of the input device 120 is received and recognized by a processor (described below) of the device. In some implementations, the pressure of the engagement and/or manipulation of the actuation surface 122 and/or the depression of the input device 120 is translated by the processor into a computer-readable form. The processor then compares the engagement and or manipulation of the capacitive pad 122 and/or the depression of the input device 120 by the user to a plurality of stored manipulations based on the input. The input may be, for example, a tap, or a double-tap.

In some implementations, a user can use various contact patterns (e.g., different timings and/or intensities of detected contacts) to provide different inputs using the input device 120 and/or the capacitive pad 122 of the wearable electronic device 100. Therefore, an input may be detected by the wearable electronic device 100 by the wearable electronic device 100 detecting a particular contact pattern. For example, an input may be provided by a user to the wearable electronic device 100 using a soft tap gesture (e.g., slightly depressing either input device 120 or pad 122 using a weak force event). As another example, an input may be provided by a user to the wearable electronic device 100 using a hard tap gesture (e.g., greatly depressing either input device 120 or pad 122 using a strong force event). Similarly, multi-soft tap and multi-hard tap gestures may be optionally detected by detecting a sequence of tap events by a user on either input device 120 or pad 122.

Referring now to FIGS. 5 to 9, illustrated therein is another implementation of a wearable electronic device 500 according to another implementation. Wearable electronic device 500 has a body 502 housing one or more electronic components (such as but not limited to a processor, memory, sensors, a charging member, etc. as described below). Body 502 defines an aperture 504 capable of receiving a user's finger.

Body 502 has a first side 505, a second side 507 opposed to the first side 505, a first end 509 and a second end 510 opposed to the first end 509, and a top portion 512 and a bottom portion 514 opposed to the top portion 512. Body 502 generally has an annular shape and includes an outer surface 506 and an inner surface 508.

Figure 5:
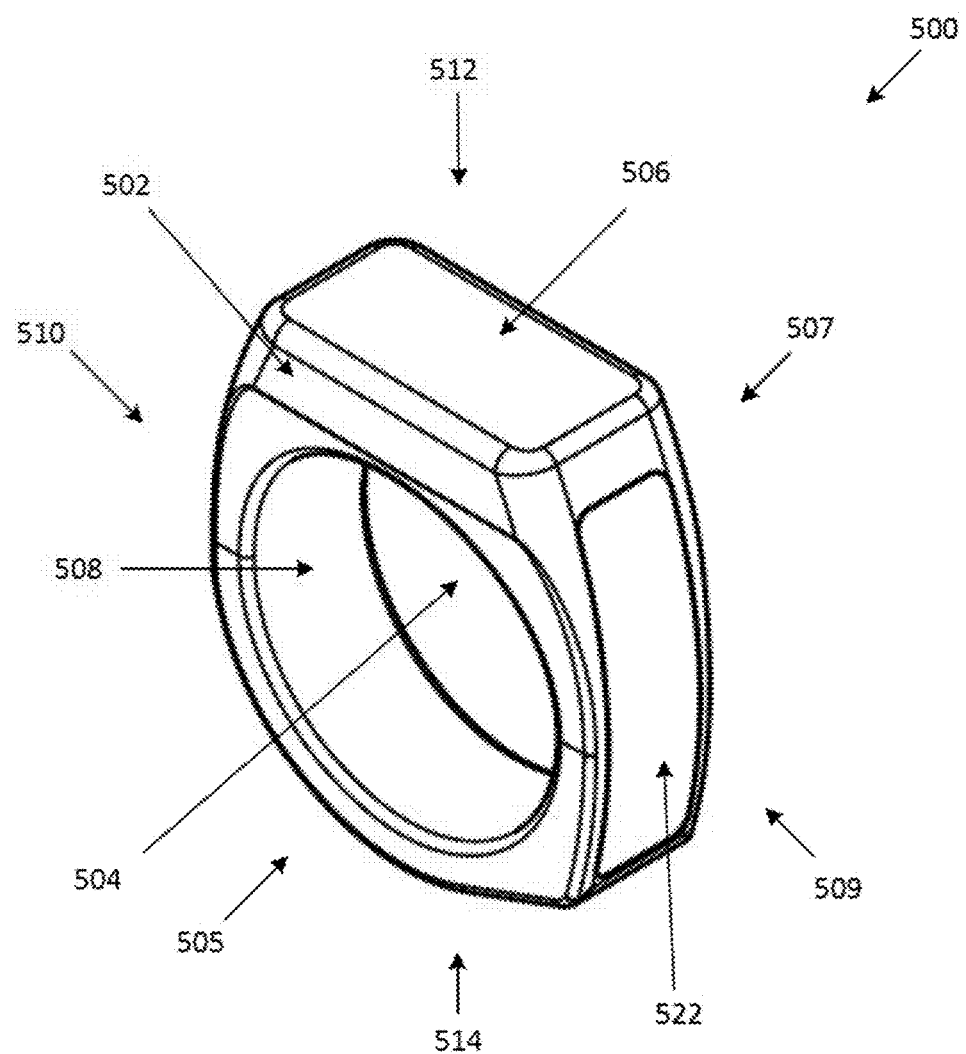
FIG. 5 is a front perspective view from above of a wearable electronic device having an inward facing input device, according to another implementation.
Figure 6:
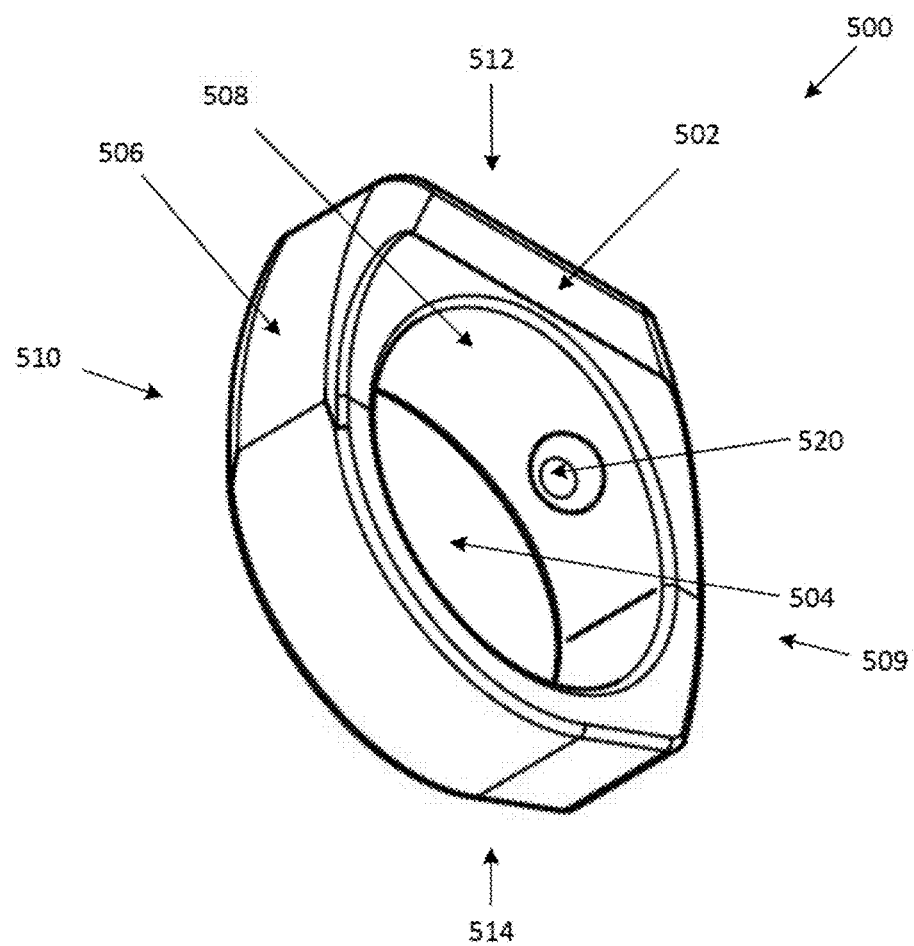
FIG. 6 is a rear perspective view from below of the wearable electronic device of FIG. 5.
Figure 7:
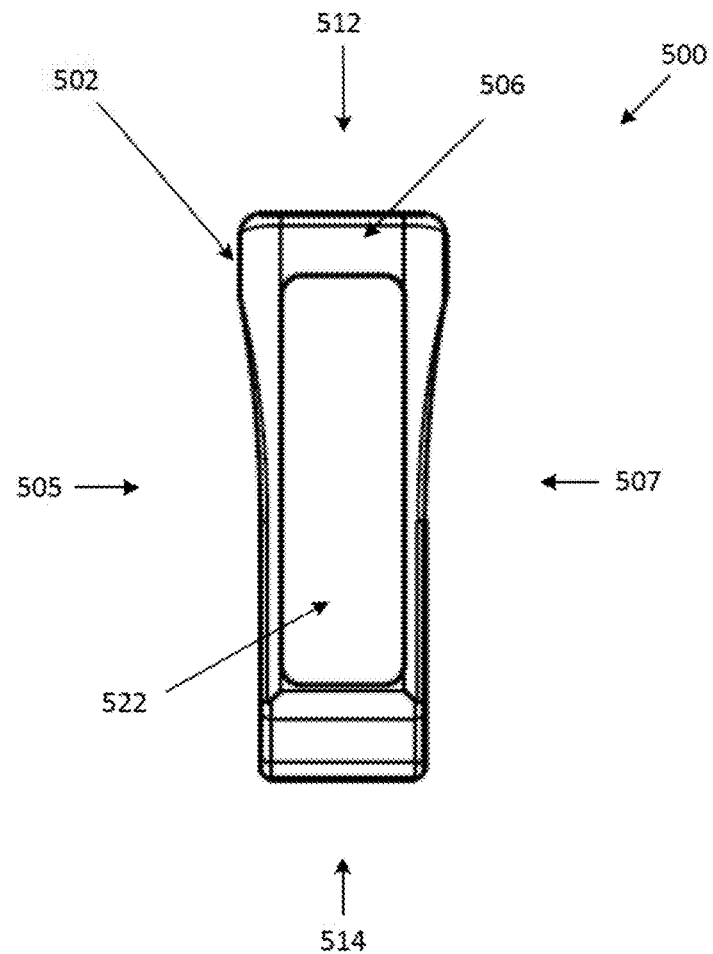
FIG. 7 is a front plan view of the wearable electronic device of FIG. 5.
Figure 8:
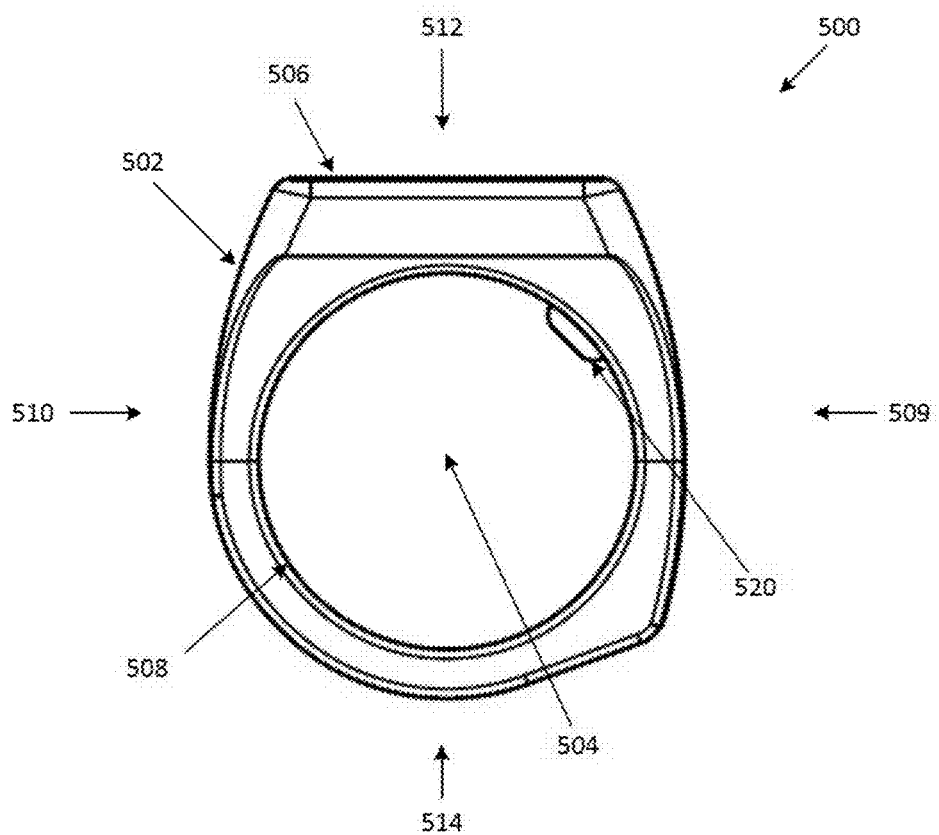
FIG. 8 is a side view of the wearable electronic device of FIG. 5.
Figure 9:
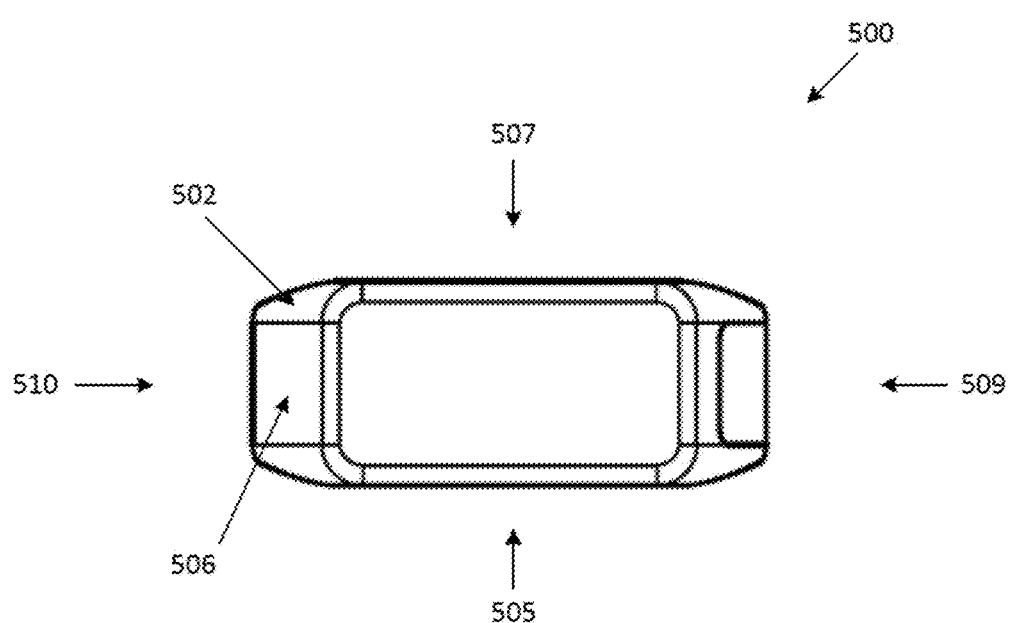
FIG. 9 is a top view of the wearable electronic device of FIG. 5.
Figure 10:
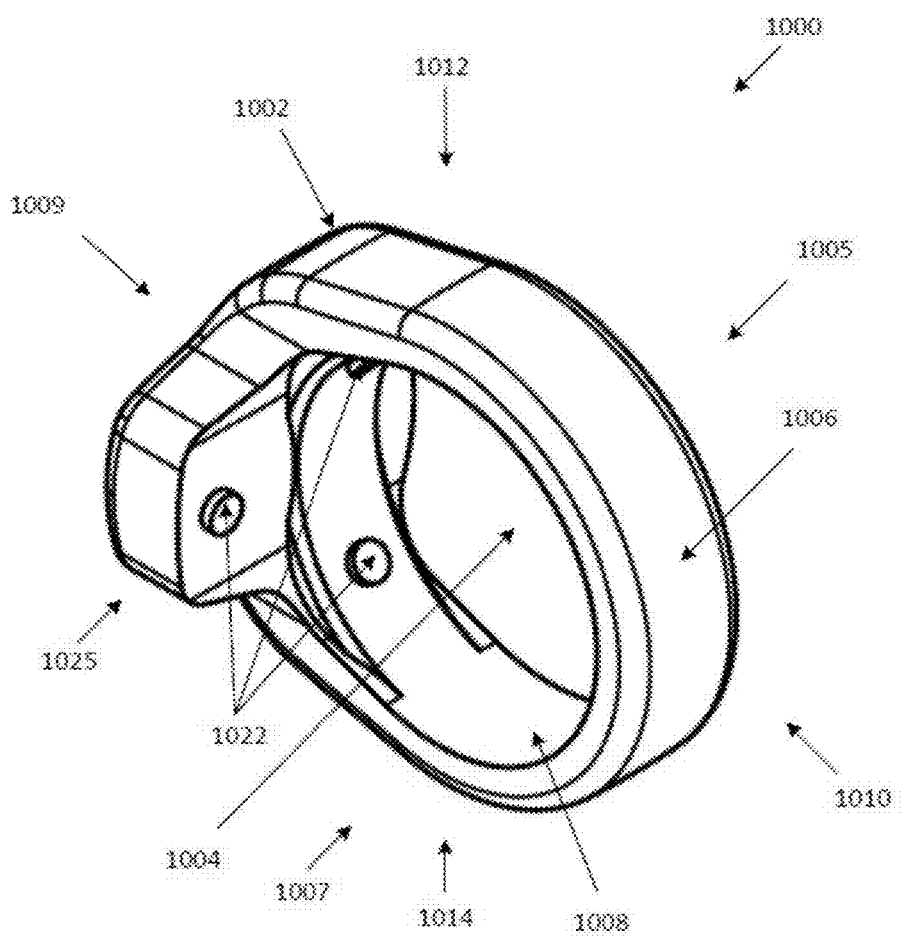
FIG. 10 is a rear perspective view from above of a wearable electronic device having an inward facing input device, according to another implementation.
Figure 11:
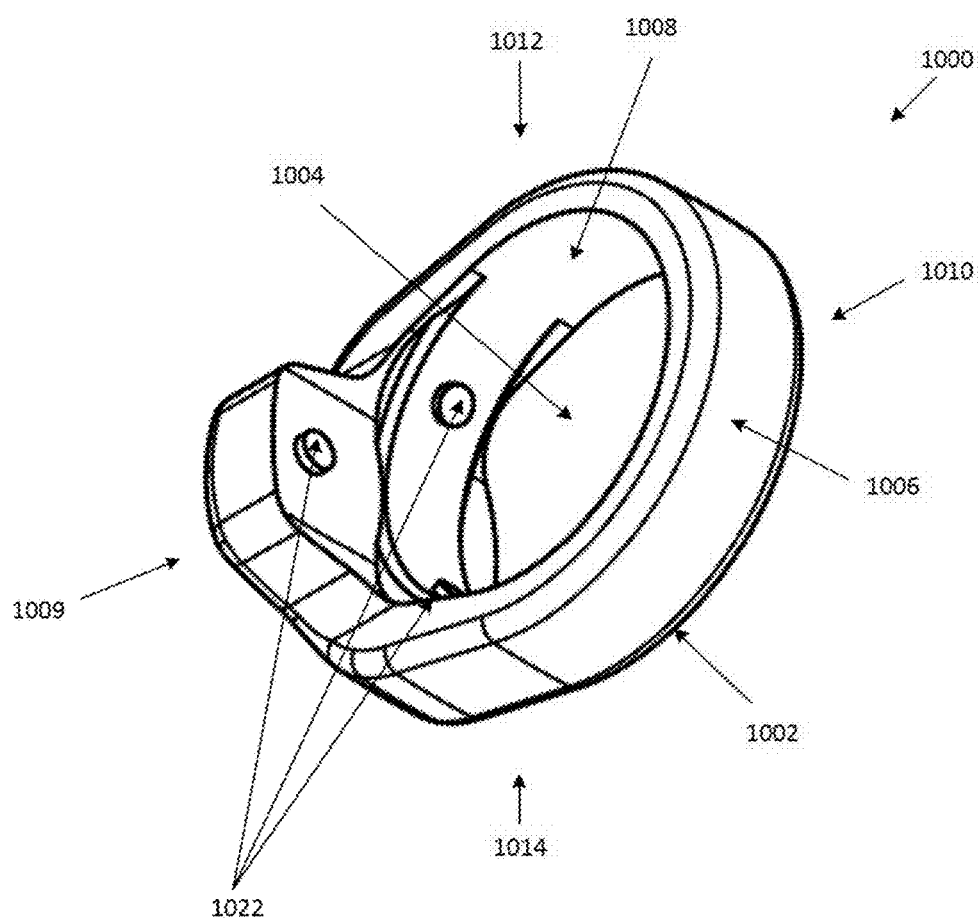
FIG. 11 is a rear perspective view from below of the wearable electronic device of FIG. 10.
Figure 12:
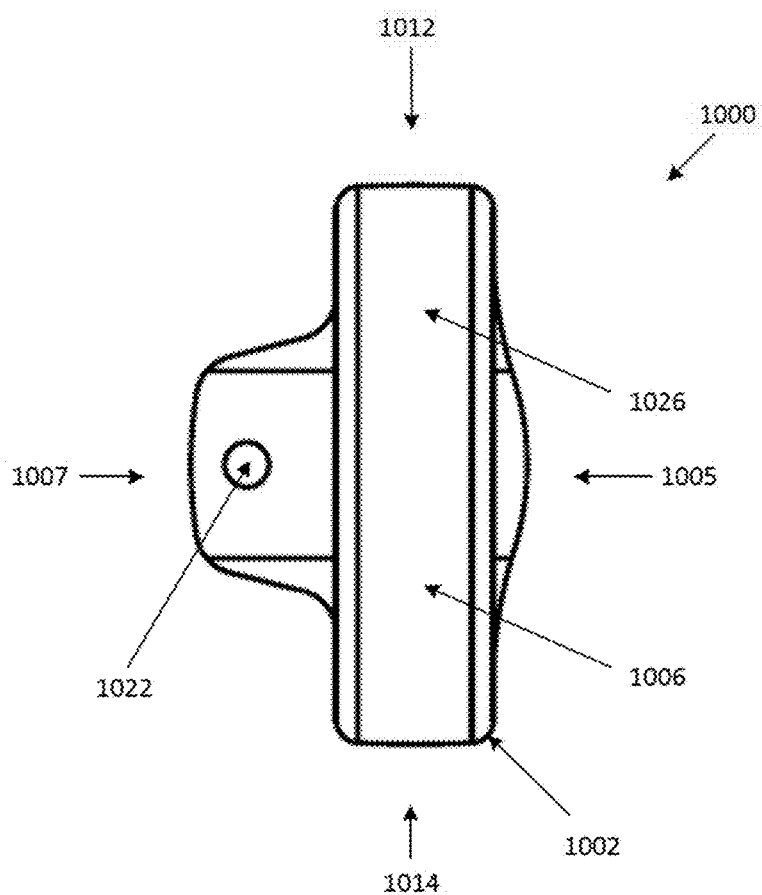
FIG. 12 is a rear plan view of the wearable electronic device of FIG. 10.
Figure 13:
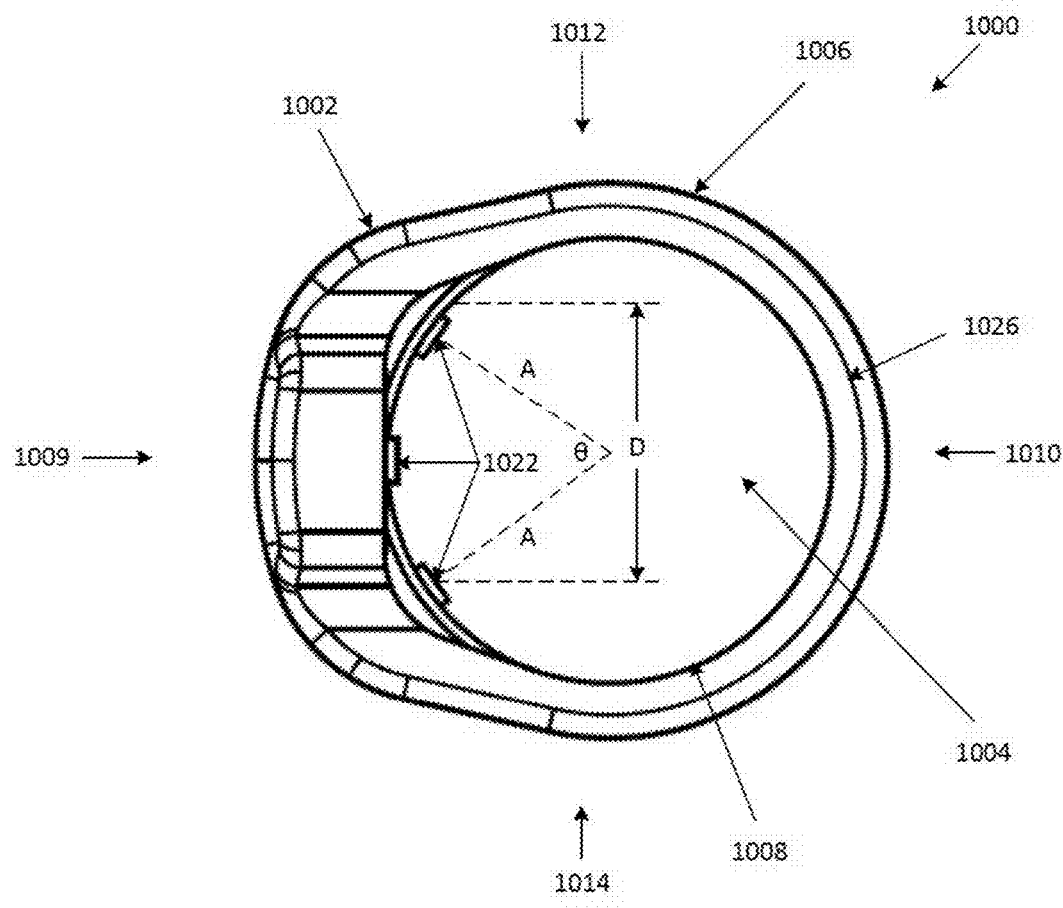
FIG. 13 is a side view of the wearable electronic device of FIG. 10.
Figure 14:
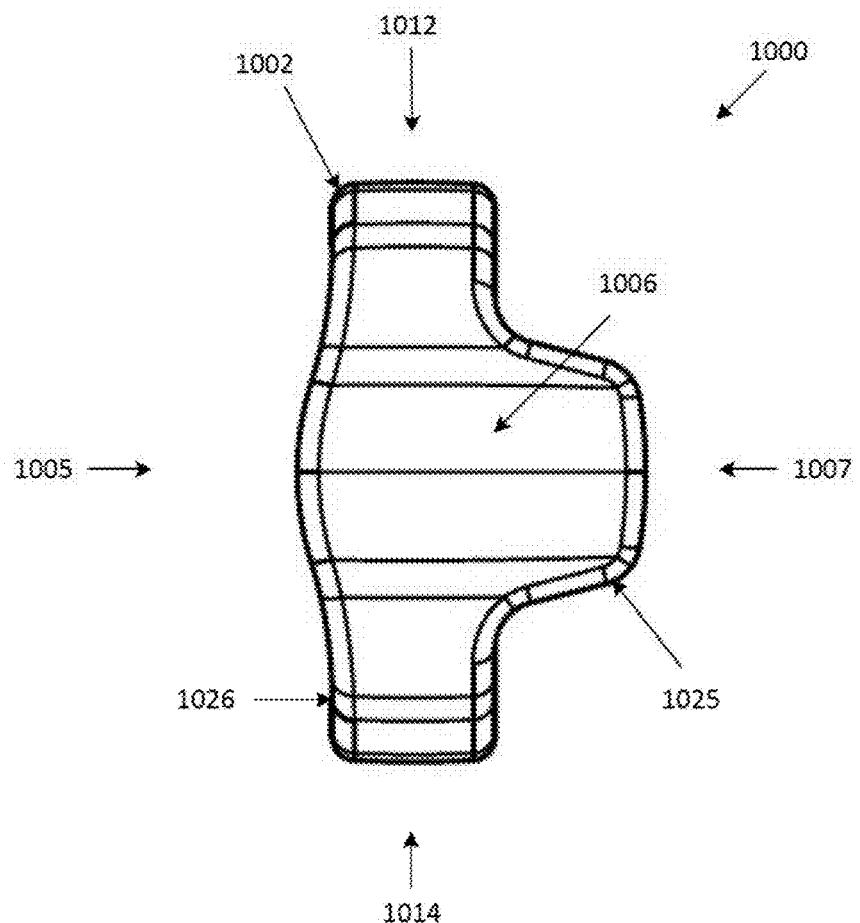
FIG. 14 is a front plan view of the wearable electronic device of FIG. 10.
Figure 15:
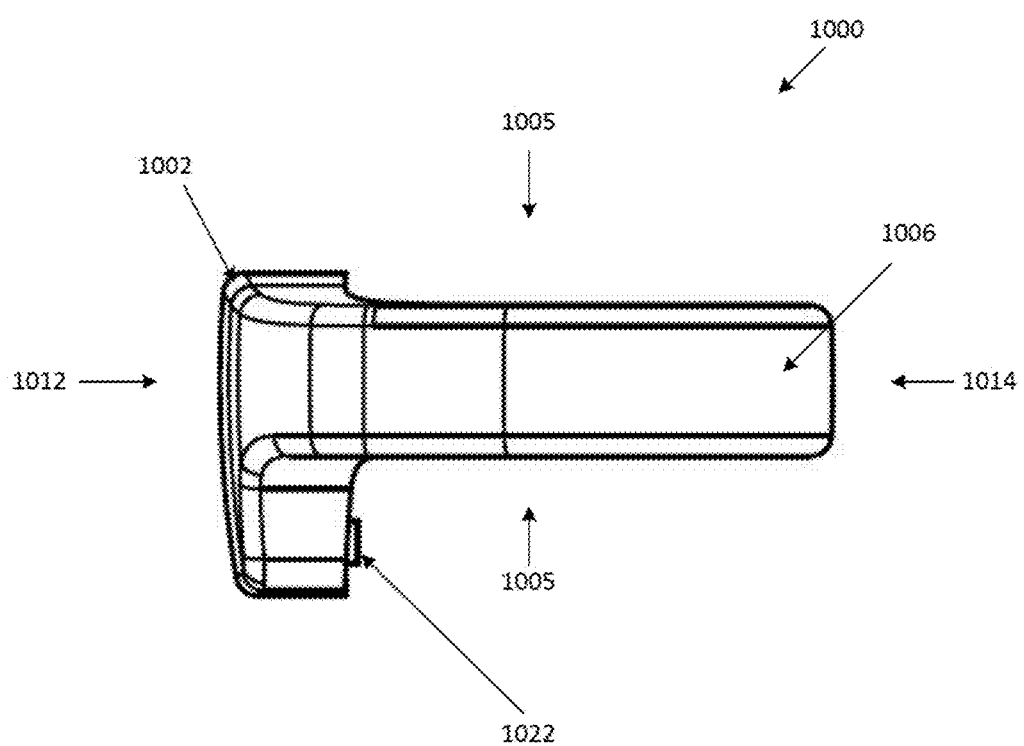
FIG. 15 is a top view of the wearable electronic device of FIG. 10.

In the implementation shown in FIG. 5, wearable electronic device 500 has a single inward facing user input device 520 (see FIG. 6) and a capacitive pad 522 for a user to provide inputs to the wearable electronic device 500. Input device 520 can assume a wide variety of forms appropriate for actuation when a user's finger (e.g., by a finger other than the finger upon which the wearable electronic device is worn) applies a force to a portion of outer surface 506 adjacent to input device 520. The user input device 520 can be mechanical, electro-mechanical, and/or sensor (e.g., a membrane sensor)-based. User input device 520 is shown as a multi-use single switch. In this implementation, input device 520 is vertically spaced apart from capacitive pad 522 such that application of a force against capacitive pad 522 will tend to not directly actuate input device 520. In the implementation shown in FIGS. 5 to 9, the input device is positioned on inner surface 508 at a positioned towards top portion 512 of the wearable electronic device 500.

Capacitive pad 522 is a touch screen or touch pad for a user to provide inputs into wearable electronic device 500. Capacitive pad 522 may be any shape or size such as but not limited to square, rectangular, circular, or oval shaped, In some implementations, the capacitive pad 522 is a capacitive touch screen, a resistive touch screen, or any other type of touch screen or touch pad known in the art. The resolution of the touch screen or pad may be approximately equal to that of the touch screen of a tablet computer or wrist computer (i.e., smart watch) or that of a laptop touchpad; in other implementations, the resolution may be greater or smaller. Capacitive pad 522 is touch sensitive, allowing taps in different areas and scrolling along the outer surface 106 of wearable electronic device 500.

The inner surface 508 is sized and/or shaped to conform to the finger of the user. The inner surface 508 thereby rests against the user's finger when the device 500 is worn by the user. Wearable electronic device 500 may be available in a variety of sizes for accommodating various finger sizes and/or various types of fingers.

In some implementations, the body 502 is made from a rigid or semi-rigid material such as a metal or a plastic. For instance, the body 502 may be made of gold, silver, platinum, or any other appropriate metal.

An input can be provided to the wearable electronic device 500 by the user engaging input device 520 and/or capacitive pad 522. For instance, a user can engage the input device 520 when a finger of the user makes physical contact with outer surface 506. The physical actuation (e.g., manipulation) of pad 522 is received and recognized by a processor (described below) of the device. The physical actuation (e.g., manipulation) of outer surface 506 adjacent to an input device 520 depresses the input device 520 against the user's finger when the wearable electronic device 1000 is worn by the user, and the depression is received and recognized by a processor (described below) of the device. In some implementations, the pressure of the engagement and/or manipulation of the outer surface 506 is translated by the processor into a computer-readable form. The processor then compares the engagement and or manipulation of either pad 522 or input device 520 by the user to a plurality of stored manipulations based on the input. The input may be, for example, a tap, or a double-tap.

In some implementations, a user can use various contact patterns (e.g., different timings and/or intensities of detected contacts) to provide different inputs using the input device 520 and/or the capacitive pad 522 of the wearable electronic device 500. Therefore, an input may be detected by the wearable electronic device 500 by the wearable electronic device 500 detecting a particular contact pattern. For example, an input may be provided by a user to the wearable electronic device 500 using a soft tap gesture (e.g., slightly depressing either input device 520 or pad 522 using a weak force event). As another example, an input may be provided by a user to the wearable electronic device 500 using a hard tap gesture (e.g., greatly depressing either input device 520 or pad 522 using a strong force event). Similarly, multi-soft tap and multi-hard tap gestures may be optionally detected by detecting a sequence of tap events by a user on either input device 520 or pad 522.

Referring now to FIGS. 10 to 15, illustrated therein is another implementation of a wearable electronic device 1000 according to another implementation. Wearable electronic device 1000 has a body 1002 housing one or more electronic components (such as but not limited to a processor, memory, sensors, a charging member, etc. as described below). Body 1002 defines an aperture 1004 capable of receiving a user's finger.

Body 1002 has a first side 1005, a second side 1007 opposed to the first side 1005, a first end 1009 and a second end 1010 opposed to the first end 1009, and a top portion 1012 and a bottom portion 1014 opposed to the top portion 1012. Body 1002 generally has an annular shape and includes an outer surface 1006 and an inner surface 1008. Body 1002 also includes a protrusion 1025 extending laterally from the body 1002 in a direction towards one of sides 1005 and 1007. In the implementation shown in FIGS. 10 to 15, protrusion 1025 extends from body 1002 in a direction towards second side 1007.

In the implementation shown in FIGS. 10 to 15, wearable electronic device 1000 has three inward facing user input devices 1022 (see FIGS. 10 and 11) for a user to provide inputs to the wearable electronic device 1000. Input devices 1022 can assume a wide variety of forms appropriate for actuation when a user's finger (e.g., by a finger other than the finger upon which the wearable electronic device is worn) applies a force to a portion of outer surface 1006 adjacent to one of input devices 1022. User input devices 1022 are each shown as a multi-use single switch.

In some implementations, input devices 1022 are arranged on inner surface 1008 of wearable electronic device 1000 to inhibit accidental activation (e.g., actuation) of two of the input devices 1022 concurrently (e.g., at the same time). For instance, in the implementation shown in FIGS. 10 to 15 where wearable electronic device 1000 has three input devices 1022, one input device 1022 is shown as extending from inner surface 1008 of protrusion 1025 (e.g., laterally spaced from the other two user input devices 1022) in a direction towards second end 1010 such that a user applying a force to the portion of the outer surface 1006 on the protrusion 1025 will direct the input device 1022 towards and against the user's finger (when the wearable device 1000 is being worn by the user). In this implementation, the user input device 1022 positioned on the protrusion 1025 is laterally spaced from the other two user input devices 1022 positioned on inner surface 1008 of an annular portion 1026 of the body 1002 of the wearable electronic device 1000 such that application of a force on outer surface 1006 adjacent to the input device 1022 on the protrusion 1025 results in the other two user input devices 1022 positioned on inner surface 1008 of an annular portion 1026 of the body 1002 slightly lifting from the user's finger. Further, the two user input devices 1022 aligned on the inner surface 1008 of the annular portion 1026 of the body 1002 are separated by a distance D (see FIG. 13) such that application of a force upon outer surface 1006 adjacent to any one of the user input devices 1022 positioned on the annular portion 1026 does not substantially direct the other user input devices 1022 towards the finger of the user inserted through the aperture 1004. As shown on FIG. 13, each of the input devices 1022 positioned on the annular portion 1026 of the body 1002 defines an axis A, the two axes A meeting at a center of the body at an angle θ. In some implementations, to inhibit application of a force along either axis A from resulting in the actuation (e.g., activation) of an input device not directly acted upon, the angle θ is about 70 degrees.

The inner surface 1008 is sized and/or shaped to conform to the finger of the user. The inner surface 1008 thereby rests against the user's finger when the device 1000 is worn by the user. Wearable electronic device 1000 may be available in a variety of sizes for accommodating various finger sizes and/or various types of fingers.

In some implementations, the body 1002 is made from a rigid or semi-rigid material such as a metal or a plastic. For instance, the body 1002 may be made of gold, silver, platinum, or any other appropriate metal.

An input can be provided to the wearable electronic device 1000 by the user engaging input devices 1022. For instance, a user can engage any one of the input devices 1022 when a finger of the user makes physical contact with outer surface 1006 adjacent to the respective input device 1022. The physical actuation (e.g., manipulation) of outer surface 1006 depresses the input device against the user's finger when the wearable electronic device 1000 is worn by the user, and the depression is received and recognized by a processor (described below) of the device. In some implementations, the pressure of the engagement and/or manipulation of the outer surface 1006 is translated by the processor into a computer-readable form. The processor then compares the engagement and or manipulation of the actuation surface by the user to a plurality of stored manipulations based on the input. The input may be, for example, a tap, or a double-tap.

In some implementations, a user can use various contact patterns (e.g., different timings and/or intensities of detected contacts) to provide different inputs using the input devices 1022 of the wearable electronic device 1000. Therefore, an input may be detected by the wearable electronic device 1000 by the wearable electronic device 1000 detecting a particular contact pattern. For example, an input may be provided by a user to the wearable electronic device 1000 using a soft tap gesture (e.g., slightly depressing one of input devices 1022 using a weak force event). As another example, an input may be provided by a user to the wearable electronic device 1000 using a hard tap gesture (e.g., greatly depressing one of input devices 1022 using a strong force event). Similarly, multi-soft tap and multi-hard tap gestures may be optionally detected by detecting a sequence of tap events by a user on one of input devices 1022. Further, gestures may optionally be detected by detecting simultaneous input by a user on more than one of input devices 1022. Further still, multi-tap gestures may optionally be detected by detecting a sequence of tap events by a user on more than one of input devices 1022.

Additionally or alternatively, each of the input devices 1022 could be calibrated, programmed, or otherwise assigned to activate specific functionality or shortcuts on a device being controlled by wearable electronic device 1000. For example, at least one input device 1022 could be used to detect coarse selection options, such as flipping through entire pages of a menu on a display with one input, whereas at least one other input device 1022 could be used to detect fine selection between individual items within the menu page. As another example, at least one input device 1022 could be assigned to activate commonly used shortcuts/functions of a device being controlled, such as going to a home screen, going back one selection in a menu, or confirming a selection.

Figure 16:
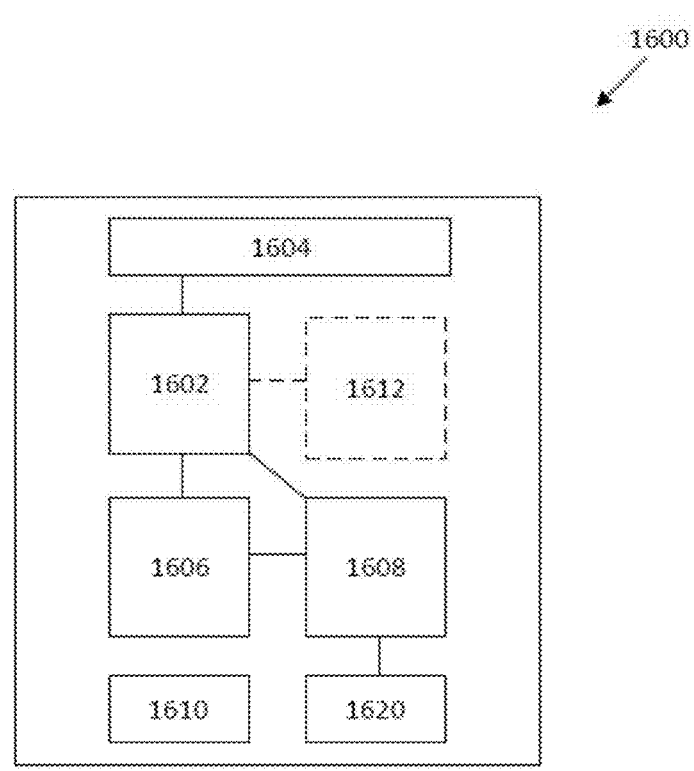
FIG. 16 is a block diagram illustrating a wearable electronic device, according to one implementation.

FIG. 16 is a block diagram illustrating a wearable electronic device 1600 with an input device in accordance with some implementations. Device 1600 includes memory 1602 that optionally includes one or more computer readable storage mediums, one or more processing units (CPUs) 1604, RF circuitry 1606, an input/output (I/O) subsystem 1608 and a power system 1610. Wearable electronic device 1600 optionally includes one or more sensors 1612.

Memory 1602 optionally includes high-speed random access memory and optionally also includes non-volatile memory, such as one or more magnetic disk storage devices, flash memory devices, or other non-volatile solid-state memory devices. Access to memory 1602 by other components of wearable electronic device 1600, such as CPU(s) 1604 is, optionally, controlled by a memory controller (not shown).

The one or more processors 1604 run or execute various software programs and/or sets of instructions stored in memory 1602 to perform various functions for wearable electronic device 1600 and to process data.

RF (radio frequency) circuitry 1606 receives and sends RF signals, also called electromagnetic signals. RF circuitry 1606 converts electrical signals to/from electromagnetic signals and communicates with communications networks and other communications devices via the electromagnetic signals. RF circuitry 1606 optionally includes well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 1606 optionally communicates with networks, such as the Internet, an intranet and/or a wireless network, such as a cellular telephone network, a wireless local area network (LAN) and/or a metropolitan area network (MAN), and other devices by wireless communication.

I/O subsystem 1608 couples input/output peripherals of wearable electronic device 1600, such as input device 1620 and other input or control devices, with a peripherals interface (not shown). I/O subsystem 1608 includes a controller for the input device 1620.

Power system 1610 is generally for powering the various components of the wearable electronic device 1600. Power system 1610 optionally includes a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices. The recharging system may be configured to receive wired power (from e.g., a micro-USB charger) or wireless power transmitted via electromagnetic waves and to provide the wired power to the one or more power sources.

Wearable electronic device 1600 optionally also includes one or more accelerometers, gyroscopes, and/or magnetometers (e.g., as part of an inertial measurement unit (IMU)) for obtaining information concerning the position (e.g., attitude) of the device. In some implementations, these sensors can be coupled with a peripherals interface (not shown)

It should be appreciated that wearable electronic device 1600 is only one example of a wearable electronic device, and that wearable electronic device 1600 optionally has more or fewer components than shown, optionally combines two or more components, or optionally has a different configuration or arrangement of the components. The various components shown in FIG. 16 are implemented in hardware, software, firmware, or a combination thereof, including one or more signal processing and/or application specific integrated circuits.

Figure 17:
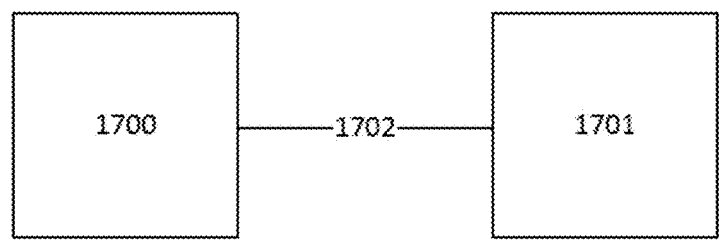
FIG. 17 is a block diagram illustrating a wearable electronic device communicating with an external electronic device, according to one implementation.

FIG. 17 is a block diagram illustrating a system of an external electronic device 1701 communicating with a wearable electronic device 1700 in accordance with implementations described herein, according to one implementation.

External electronic device 1701 may be any external electronic device capable of being controlled by the wearable electronic device 1700 according to the implementations described herein. For example, the external electronic device may be a portable computing device such as a tablet, a desktop computer, a smartphone, a storage device, a portable media player, a navigation system, or another wearable electronic device.

Electronic device 1701 may include a display screen displaying a user interface for viewing by the user of the wearable electronic device 1700. Wearable electronic device 1700 communicates with the external electronic device 1701 via a network 1702, which may be a WI-FI network, a Bluetooth™ connection, a NFC connection, or any other type of wireless connection capable of providing uni-directional or bi-directional communication between the external electronic device 1701 and the wearable electronic device 1700.

Figure 18:
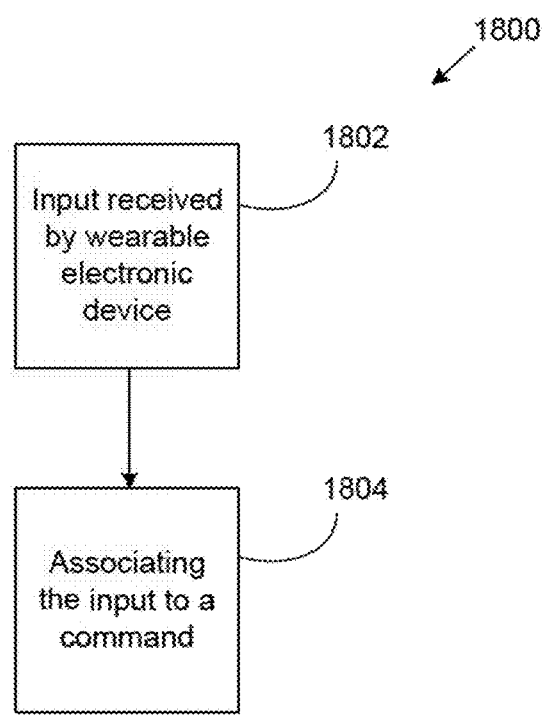
FIG. 18 is a flowchart of a method for controlling an external electronic device, according to one implementation.

Referring now to FIG. 18, illustrated therein is a flowchart of a method 1800 for controlling an external electronic device in accordance with implementations of the wearable electronic device disclosed herein.

At 1802, input is received by the wearable electronic device from a finger of a user via an input device of the wearable electronic device. In some implementations, the input could be received by the wearable electronic device from a finger of the user via a plurality of input devices of the wearable electronic device. The input is received as a manipulation of the input device (or the plurality input devices) of the wearable electronic device. In some implementations, the input is received as a sequential manipulation of the input device (or the plurality input devices) of the wearable electronic device. In some implementations, the input is received as a simultaneous manipulation of the plurality input devices of the wearable electronic device.

At 1804, the input (i.e., manipulation of the input device) received by the wearable electronic device is associated with a command. In some implementations, the input is associated with a command by a processor of the wearable electronic computing device prior to the command being transmitted (e.g., as a signal) to the external electronic device. Alternatively or in addition, the input can be sent directly to the external electronic device for association with the corresponding command by a processor at the external electronic device. The command may be, for example, a mouse, cursor, or pointer movement, a lighting control, or other such command relating to a user interface of the external electronic device.

FIGS. 19A, 19B, 20A, 20B, 20C, 21A, 21B, 21C, 22 and 23 illustrate alternative implementations of a wearable electronic device, similar in at least some respects to wearable electronic device 100 of FIGS. 1-4, wearable electronic device 500 of FIG. 5-9, wearable electronic device 1000 of FIGS. 10-15, wearable electronic device 1600 of FIG. 16, and wearable electronic device 1700 of FIG. 17, as discussed above. Unless context dictates otherwise, the description regarding wearable electronic device 100, wearable electronic device 500, wearable electronic device 1000, wearable electronic device 1600, and wearable electronic device 1700 is applicable to the wearable electronic devices illustrated in FIGS. 19A, 19B, 20A, 20B, 20C, 21A, 21B, 21C, 22 and 23.

Figure 19A:
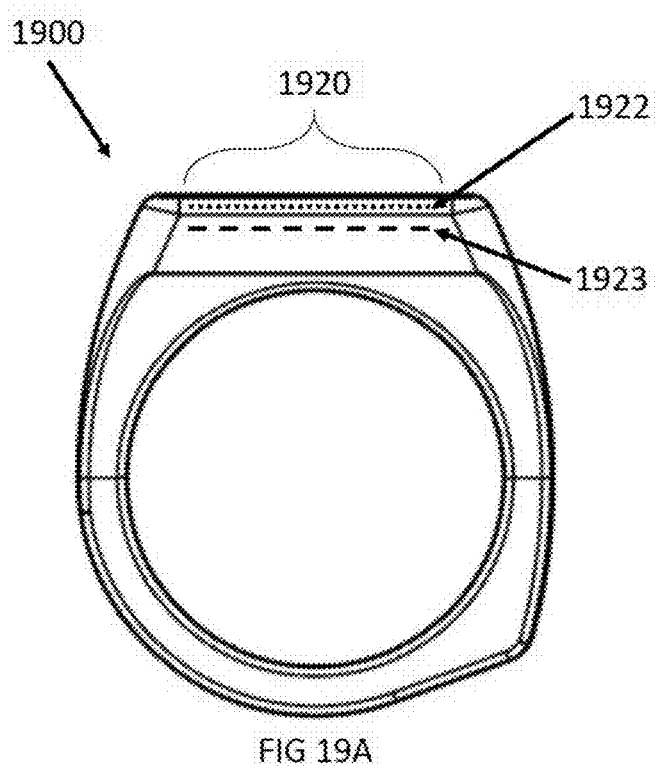
FIGS. 19A and 19B are schematic views which illustrate a wearable electronic device having an input area which includes at least one capacitive pad and at least one pressure sensing pad.
Figure 19B:
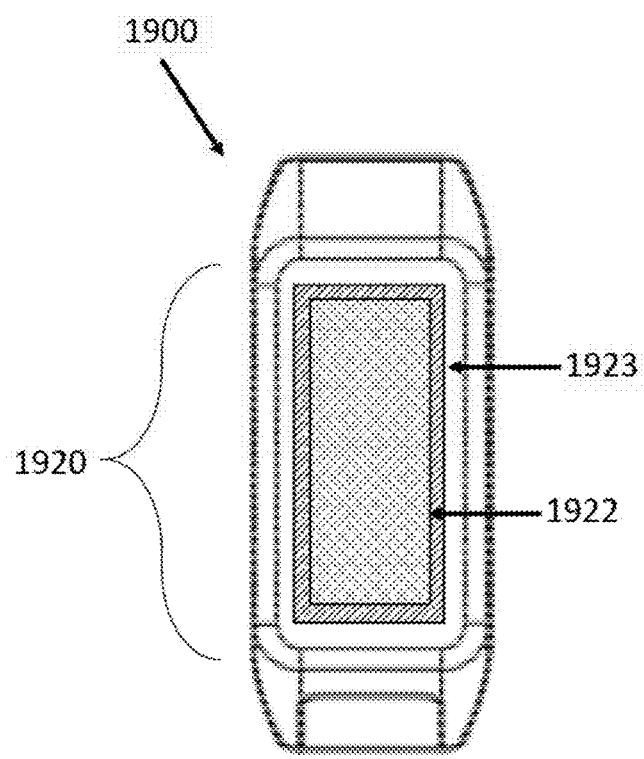

FIGS. 19A and 19B are schematic views which illustrate a wearable electronic device 1900 having an input area 1920, which includes at least one capacitive pad 1922 and at least one pressure sensing pad 1923. The at least one capacitive pad 1922 can be on top of the at least one pressure sensing pad 1923 as illustrated in FIGS. 19A and 19B, but this is not necessarily the case. In alternative implementations, the at least one pressure sensing pad 1923 can be on top of the capacitive pad 1922. Further, although capacitive pad 1922 is shown as being smaller than pressure sensing pad 1923 in FIG. 19B, this is not necessarily the case. For example, capacitive pad 1922 may be bigger than pressure sensing pad 1923. As another example, capacitive pad 1922 may occupy a different portion of the input area 1920 than pressure sensing pad 1923, with capacitive pad 1922 and pressure sensing pad 1923 only partially overlapping. Further, neither capacitive pad 1922 nor pressure sensing pad 1923 needs to be a single continuous region, but can instead be a plurality of discrete regions, as will be discussed in more detail below.

Advantageously, by positioning a capacitive pad and a pressure sensing pad overlaying each other within an input area, size of the wearable electronic device can be reduced, while still providing flexible and powerful mechanisms for detecting user input.

Capacitive Pad

Figure 20A:
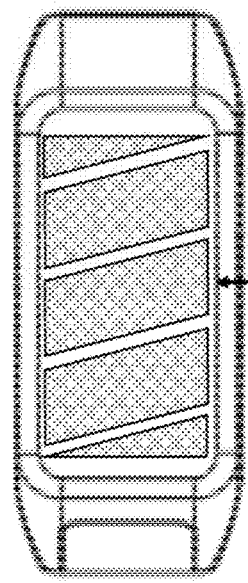
FIGS. 20A, 20B, and 20C are schematic views which illustrate exemplary capacitive pads that could be implemented in any of the wearable electronic devices herein.
Figure 20B:
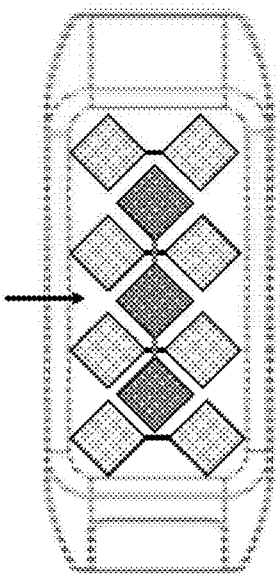
Figure 20C:
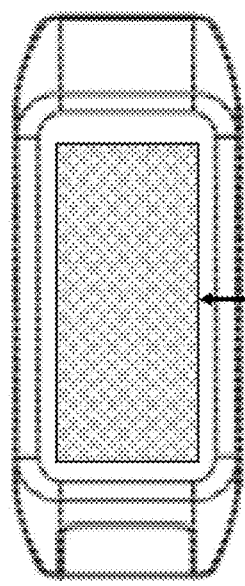

FIGS. 20A, 20B, and 20C are schematic views which illustrate exemplary capacitive pads that could be implemented in any of the wearable electronic devices herein.

In one implementation, a capacitive pad could comprise a one-dimensional (1D, linear) array of discrete capacitive sensors such as capacitive sensor array 2022*a* in FIG. 20A. Such a 1D array could be used for inputting 1D sliding gestures (vertical up and/or down swipe gestures in the case of FIG. 20A), such as for scrolling through options in a 1D menu. In other implementations, a capacitive pad could comprise a two-dimensional (2D, planar) array of discrete capacitive sensors such as capacitive sensor array 2022*b* shown in FIG. 20B. A 2D array could be used to input 2D sliding gestures, such as up, down, left, and right. If the 2D array is precise enough, directional gestures could be detected in any direction, such as up-left, down-right, or similar. Further, if the 2D array is precise enough, complex and/or compound gestures could be detected, such as writing characters, or inputting multi-instruction swipe gestures like left-right-up. In other implementations, a capacitive pad could comprise an analog capacitive sensor such as capacitive sensor 2022*c* shown in FIG. 20C, which theoretically could provide near-infinite detection of user finger position, enabling precise and complex gesture and swipe input.

Any of the described capacitive pads could be used to detect the speed and length of a swipe or directional input from a user, which could be mapped to different functions. For example, a slow swipe could scroll through one item in a menu, whereas a fast swipe could scroll through many items in a menu.

Any of the described capacitive pads could be used to detect "click" inputs by detecting when a user touches the capacitive pad and subsequently removes their finger. Any of the described capacitive pads could also be used to detect "click and hold" inputs by detecting when a user touches the capacitive pad but does not remove their finger for some period of time.

Pressure Sensing Pad

Figure 21A:
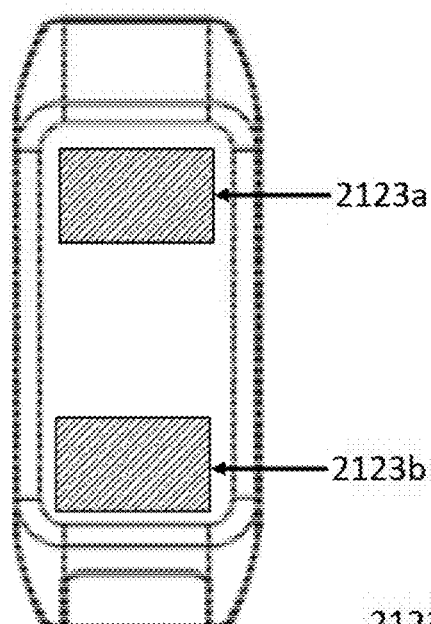
FIGS. 21A, 21B, and 21C are schematic views which illustrate exemplary pressure sensing pads that could be implemented in any of the wearable electronic devices herein.
Figure 21B:
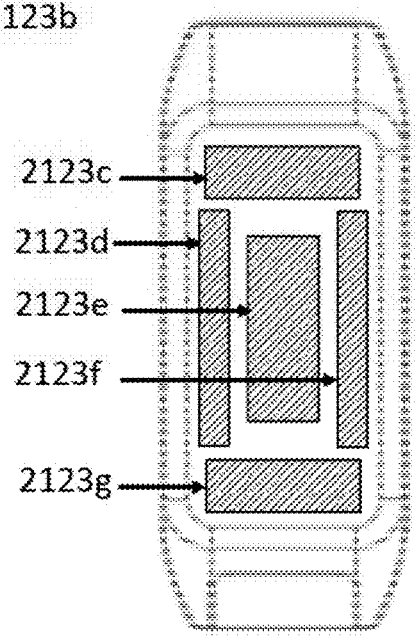
Figure 21C:
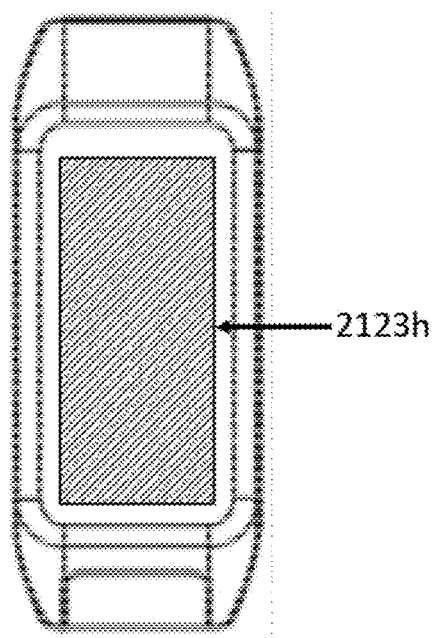

FIGS. 21A, 21B, and 21C are schematic views which illustrate exemplary pressure sensing pads that could be implemented in any of the wearable electronic devices herein.

In one implementation, an input area could include one (or more) discrete pressure sensing pads disposed at different positions in the input area, such as a pressure sensing pad 2123*a* at a top of the input area and a pressure sensing pad 2123*b* at a bottom of the input area, as illustrated in FIG. 21A. Each discrete pressure sensing pad can be mapped to a different command. For example, the top pressure sensing pad 2123*a* could, in response to a hard press, act as a shortcut which sends the user to the top of a long list. Alternatively, the top pressure sensing pad 2123*a* could, in response to a long press, scroll upwards through the long list. The bottom pressure sensing pad 2123*b* could have similar functionality in the down direction. These functions are just examples, and conceivably any shortcut could be calibrated or programmed based on different detected input pressures/durations to each pressure sensing pad.

Further, more than 2 pressure sensing pads could be used: as an example, a wearable electronic device could include five discrete pressure sensing pads as illustrated in FIG. 21B. In the example of FIG. 21B, a wearable electronic device includes a top pressure sensing pad 2123*c*, a left pressure sensing pad 2123*d*, a center pressure sensing pad 2123*e*, a right pressure sensing pad 2123*f*, and a bottom pressure sensing pad 2123*g*. Such a system could function similarly to a directional input pad or joystick, having a pressure sensing pad for each direction and a confirm button in the center. However, it is within the scope of the present systems, devices, and methods that a plurality of discrete pressure sensing pads be arranged in any appropriate orientation, with appropriate functionality assigned thereto.

In another implementation illustrated in FIG. 21C, an input area could include an analog pressure sensing pad 2123*h*, theoretically allowing near-infinite pressure detection. Shortcuts and/or functions could be calibrated/programmed for specific regions of the pressure sensing pad 2123*h* based on pressure/duration of input detected by the pressure sensing pad 2123.

Additionally, any of the above pressure sensing pads could detect "click" or "click and hold" inputs from a user, requiring a certain pressure threshold to be exceeded.

Capacitive Pad and Pressure Sensing Pad Combination

By including at least one capacitive pad and at least one pressure sensing pad on a wearable electronic device, a great number of input capabilities can be realized.

Figure 22:
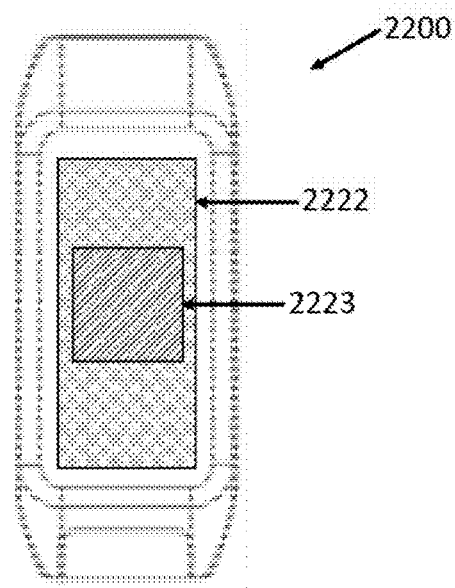
FIGS. 22 and 23 are schematic views which illustrate wearable electronic devices having an input area which includes at least one capacitive pad and at least one pressure sensing pad.

As one example illustrated in FIG. 22, a wearable electronic device 2200 could have an input area which includes a capacitive pad 2222 such as a capacitive sensing array or analog capacitive sensing area, and a pressure sensing pad 2223. The capacitive pad 2222 could be used to detect swipe gestures for navigating menus, and the pressure sensing pad 2223 could be used as a confirm button with a minimum pressure threshold. Compared to a system which utilizes a capacitive array to detect directional input and the same capacitive array to detect a confirm input, wearable electronic device 2200 enables a user to input directional and swipe commands without accidentally triggering a confirm gesture, since the user must apply a minimum pressure for the confirm input to be recognized.

Figure 23:
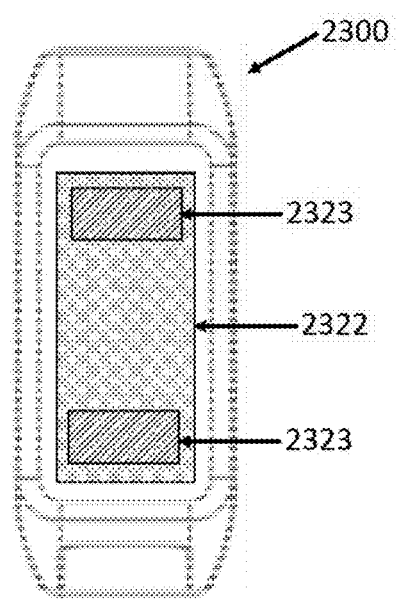

As another example illustrated in FIG. 23, a wearable electronic device 2300 could have an input area which includes at least one discrete pressure sensing pad 2323 on at least one peripheral side of the input area (or an analog pressure sensing area calibrated to similarly parse input regions), and a capacitive pad 2322 such as a capacitive sensing array or analog capacitive sensing area. The at least one pressure sensing pad 2323 at the periphery of the input area could be used to detect coarse selection options, such as flipping through entire pages of a menu with one input, whereas the capacitive pad could be used to detect swipe/directional gestures for fine selection between individual items within a menu page. Other pressure sensing pads could also be included to detect other inputs, such as a confirm input and/or a back input.

Alternatively or additionally, wearable electronic device 2300 could include at least one discrete pressure sensing pad 2323 (or an analog pressure sensing area calibrated to similarly parse input regions), and a capacitive pad 2322 such as a capacitive sensing array or analog capacitive sensing area. The discrete pressure sensing pads 2323 could be used to detect inputs corresponding to commonly used shortcuts/functions, such as going to a home screen of a device, going back one selection in a menu, or confirming a selection. The capacitive pad 2322 could be used to navigate through menus using swipe commands, for example. Placement of discrete pressure sensing pads 2323 within the input area could be determined as appropriate for a given application.

Each of the wearable electronic devices described above could include a transmitter to transmit input signals or commands from the at least one pressure sensing pad and/or the at least one capacitive pad to an external electronic device, to control the external electronic device, such as by navigating through user interfaces and menus displayed on a display of the external electronic device. The wearable electronic device could include at least one processor to process input signals, or raw input data could be transmitted directly to an external electronic device for processing on the external electronic device. The at least one processor, the at least one capacitive pad, the at least one pressure sensing pad, and the transmitter can be housed in a removable housing coupled to the body of the wearable electronic device, similar to as in FIGS. 1-4. The wearable electronic device can include a power source for providing power to the processor, the at least one capacitive pad, the at least one pressure sensing pad, and the transmitter. The power source can be a rechargeable charging member Any of the wearable electronic device described herein could include a haptic output interface which provides a specified haptic output pattern according to an action performed.

Throughout this specification and the appended claims the term "communicative" as in "communicative pathway," "communicative coupling," and in variants such as "communicatively coupled," is generally used to refer to any engineered arrangement for transferring and/or exchanging information. Exemplary communicative pathways include, but are not limited to, electrically conductive pathways (e.g., electrically conductive wires, electrically conductive traces), magnetic pathways (e.g., magnetic media), and/or optical pathways (e.g., optical fiber), and exemplary communicative couplings include, but are not limited to, electrical couplings, magnetic couplings, and/or optical couplings.

Throughout this specification and the appended claims, infinitive verb forms are often used. Examples include, without limitation: "to detect," "to provide," "to transmit," "to communicate," "to process," "to route," and the like. Unless the specific context requires otherwise, such infinitive verb forms are used in an open, inclusive sense, that is as "to, at least, detect," to, at least, provide," "to, at least, transmit," and so on.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other portable and/or wearable electronic devices, not necessarily the exemplary wearable electronic devices generally described above.

For instance, the foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various implementations described above can be combined to provide further implementations. To the extent that they are not inconsistent with the specific teachings and definitions herein, all of the following are incorporated herein by reference, in their entirety: U.S. Provisional Patent Application Ser. No. 62/607,819, and U.S. Provisional Patent Application Ser. No. 62/607,816. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A wearable electronic device comprising:
    a body having an aperture there through, the aperture sized and shaped to receive a finger of a user;
    an input area including:
        at least one pressure sensing pad to detect a first input from the user; and
        at least one capacitive pad to detect a second input from the user, the at least one capacitive pad at least partially overlapping the at least one pressure sensing pad; and
    a transmitter coupled to the at least one pressure sensing pad and the at least one capacitive area to send electronic transmissions, the electronic transmissions corresponding to the first input and the second input.

2. The wearable electronic device of claim 1, further comprising a processor coupled to the at least one pressure sensing pad, the at least one capacitive pad, and the transmitter.

3. The wearable electronic device of claim 2 wherein the processor, the at least one capacitive pad, the at least one pressure sensing pad, and the transmitter are housed in a removable housing coupled to the body.

4. The wearable electronic device of claim 3 wherein the removable housing is coupled to the body by a clip surrounding a portion of the body.

5. The wearable electronic device of claim 1 wherein the at least one capacitive pad includes a one-dimensional array of capacitive sensors.

6. The wearable electronic device of claim 1 wherein the at least one capacitive pad includes a two-dimensional array of capacitive sensors.

7. The wearable electronic device of claim 1 wherein the at least one capacitive pad includes an analog capacitive sensor.

8. The wearable electronic device of claim 1 wherein the at least one pressure sensing pad includes a single pressure sensing pad.

9. The wearable electronic device of claim 1 wherein the at least one pressure sensing pad includes a plurality of discrete pressure sensing pads.

10. The wearable electronic device of claim 1 wherein the at least one pressure sensing pad includes an analog pressure sensing pad.

11. The wearable electronic device of claim 1 wherein the body has an annular shape.

12. The wearable electronic device of claim 1, further comprising a power source for providing power to the processor, the at least one capacitive pad, the at least one pressure sensing pad, and the transmitter.

13. The wearable electronic device of claim 12 wherein the power source is a rechargeable charging member.

\* \* \* \* \*